US011408589B2

(12) United States Patent
Oganesian

(10) Patent No.: US 11,408,589 B2
(45) Date of Patent: Aug. 9, 2022

(54) MONOLITHIC MULTI-FOCUS LIGHT SOURCE DEVICE

(71) Applicant: Optiz, Inc., Palo Alto, CA (US)

(72) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 266 days.

(21) Appl. No.: 16/704,280

(22) Filed: Dec. 5, 2019

(65) Prior Publication Data

US 2021/0172581 A1 Jun. 10, 2021

(51) Int. Cl.
H01L 23/538 (2006.01)
H01L 23/13 (2006.01)
F21V 5/04 (2006.01)
H01L 33/62 (2010.01)
H01L 23/14 (2006.01)
(Continued)

(52) U.S. Cl.
CPC .............. F21V 5/045 (2013.01); F21V 5/004 (2013.01); F21V 5/007 (2013.01); F21V 7/28 (2018.02); F21V 9/04 (2013.01); F21V 13/14 (2013.01); F21V 19/0025 (2013.01); H01L 21/4853 (2013.01); H01L 23/13 (2013.01); H01L 23/145 (2013.01); H01L 23/147 (2013.01); H01L 23/49816 (2013.01); H01L 23/5389 (2013.01); H01L 25/0753 (2013.01);
(Continued)

(58) Field of Classification Search
CPC .......... F21V 5/045; F21V 5/004; F21V 5/007; F21V 7/28; F21V 9/04; F21V 13/14; F21V 19/0025; H01L 21/4853; H01L 23/13; H01L 23/145; H01L 23/147; H01L 23/49816; H01L 23/5389; H01L 25/0753; H01L 33/483; H01L 33/62; H01L 33/58; H01L 33/60; H01L 33/48–648; H01L 2933/0033; H01L 2933/005; H01L 2933/0066–0091; H01L 25/167; H01L 33/50–508; H01L 2933/0041; F21Y 2105/12; F21Y 2115/10; G02B 3/10; G02B 6/003
See application file for complete search history.

(56) References Cited

U.S. PATENT DOCUMENTS 4,904,512 A 2/1990 Yamada et al.
5,750,156 A 5/1998 Maus et al.
(Continued)

FOREIGN PATENT DOCUMENTS

CN 101890817 A 11/2010
JP S62-235787 A 10/1987
(Continued)

Primary Examiner — Cuong B Nguyen
(74) Attorney, Agent, or Firm — DLA Piper LLP (US)

(57) ABSTRACT

A light source device that includes a light device assembly and a monolithic lens. The light device assembly includes a first substrate with opposing top and bottom surfaces and a plurality of cavities formed into the top surface, a plurality of light source chips each disposed at least partially in one of the plurality of cavities and each including a light emitting device and electrical contacts, and a plurality of electrodes each extending between the top and bottom surfaces and each electrically connected to one of the electrical contacts. The monolithic lens is disposed over the top surface of the first substrate, and includes a unitary substrate with a plurality of lens segments each disposed over one of the light source chips.

19 Claims, 25 Drawing Sheets

(51) Int. Cl.
  *H01L 23/498* (2006.01)
  *H01L 25/075* (2006.01)
  *F21V 19/00* (2006.01)
  *F21V 7/28* (2018.01)
  *F21V 5/00* (2018.01)
  *H01L 21/48* (2006.01)
  *H01L 33/48* (2010.01)
  *F21V 9/04* (2018.01)
  *F21V 13/14* (2006.01)
  *F21Y 105/12* (2016.01)
  *F21Y 115/10* (2016.01)

(52) U.S. Cl.
  CPC ............ *H01L 33/483* (2013.01); *H01L 33/62* (2013.01); *F21Y 2105/12* (2016.08); *F21Y 2115/10* (2016.08)

(56) References Cited

U.S. PATENT DOCUMENTS

| | | | |
|---|---|---|---|
| 5,914,074 | A | 6/1999 | Martin et al. |
| 6,683,421 | B1 | 1/2004 | Kennedy et al. |
| 6,777,767 | B2 | 8/2004 | Badehi |
| 7,033,664 | B2 | 4/2006 | Zilber et al. |
| 7,070,406 | B2 | 7/2006 | Jeans |
| 7,157,742 | B2 | 1/2007 | Badehi |
| 7,859,033 | B2 | 12/2010 | Brady |
| 8,432,011 | B1 | 4/2013 | Oganesian |
| 8,546,900 | B2 | 10/2013 | Oganesian |
| 8,546,951 | B2 | 10/2013 | Oganesian |
| 8,552,518 | B2 | 10/2013 | Oganesian |
| 8,570,669 | B2 | 10/2013 | Oganesian |
| 8,604,576 | B2 | 12/2013 | Oganesian |
| 8,692,344 | B2 | 4/2014 | Oganesian |
| 8,759,930 | B2 | 6/2014 | Oganesian |
| 8,796,800 | B2 | 8/2014 | Oganesian |
| 8,921,759 | B2 | 12/2014 | Oganesian |
| 9,018,725 | B2 | 4/2015 | Oganesian |
| 9,233,511 | B2 | 1/2016 | Oganesian |
| 10,679,976 | B2 | 6/2020 | Geiger |
| 2003/0230817 | A1 | 12/2003 | Crook |
| 2004/0251525 | A1 | 12/2004 | Zilber |
| 2005/0104179 | A1 | 5/2005 | Zilber |
| 2005/0205977 | A1 | 9/2005 | Zilber |
| 2006/0163596 | A1* | 7/2006 | Kim .................. G02F 1/133603 257/98 |
| 2007/0138498 | A1 | 6/2007 | Zilber |
| 2007/0190691 | A1 | 8/2007 | Humpston |
| 2007/0190747 | A1 | 8/2007 | Humpston |
| 2008/0012115 | A1 | 1/2008 | Zilber |
| 2008/0017879 | A1 | 1/2008 | Zilber |
| 2008/0083976 | A1 | 4/2008 | Haba |
| 2008/0083977 | A1 | 4/2008 | Haba |
| 2008/0099900 | A1 | 5/2008 | Oganesian |
| 2008/0099907 | A1 | 5/2008 | Oganesian |
| 2008/0116544 | A1 | 5/2008 | Grinman |
| 2008/0116545 | A1 | 5/2008 | Grinman |
| 2008/0150121 | A1 | 6/2008 | Oganesian |
| 2008/0246136 | A1 | 10/2008 | Haba |
| 2009/0115047 | A1 | 5/2009 | Haba |
| 2009/0160065 | A1 | 6/2009 | Haba |
| 2009/0212381 | A1 | 8/2009 | Crisp |
| 2010/0053407 | A1 | 3/2010 | Crisp |
| 2010/0207142 | A1 | 8/2010 | Chen |
| 2010/0225006 | A1 | 9/2010 | Haba |
| 2010/0230803 | A1 | 9/2010 | Chien et al. |
| 2010/0230812 | A1 | 9/2010 | Oganesian |
| 2010/0237452 | A1 | 9/2010 | Hagiwara et al. |
| 2011/0012259 | A1 | 1/2011 | Grinman |
| 2011/0031509 | A1 | 2/2011 | Kirihara et al. |
| 2011/0031629 | A1 | 2/2011 | Haba |
| 2011/0033979 | A1 | 2/2011 | Haba |
| 2011/0049696 | A1 | 3/2011 | Haba |
| 2011/0187007 | A1 | 8/2011 | Haba |
| 2011/0215342 | A1* | 9/2011 | Oliver ..................... B29C 43/18 257/81 |
| 2012/0018863 | A1 | 1/2012 | Oganesian |
| 2012/0018868 | A1 | 1/2012 | Oganesian |
| 2012/0018893 | A1 | 1/2012 | Oganesian |
| 2012/0018894 | A1 | 1/2012 | Oganesian |
| 2012/0018895 | A1 | 1/2012 | Oganesian |
| 2012/0020026 | A1 | 1/2012 | Oganesian |
| 2012/0037935 | A1* | 2/2012 | Yang ..................... H01L 33/642 257/98 |
| 2012/0068327 | A1 | 3/2012 | Oganesian |
| 2012/0068330 | A1 | 3/2012 | Oganesian |
| 2012/0068351 | A1 | 3/2012 | Oganesian |
| 2012/0068352 | A1 | 3/2012 | Oganesian |
| 2012/0182623 | A1 | 7/2012 | Wippermann et al. |
| 2013/0168791 | A1 | 7/2013 | Oganesian |
| 2013/0249031 | A1 | 9/2013 | Oganesian |
| 2014/0232293 | A1 | 8/2014 | Kam et al. |
| 2015/0355470 | A1* | 12/2015 | Herschbach ............... F21V 5/08 362/11 |
| 2017/0242160 | A1* | 8/2017 | Zhang .................. G02B 3/0012 |

FOREIGN PATENT DOCUMENTS

| | | |
|---|---|---|
| JP | H02-078102 A | 3/1990 |
| JP | 2-405304 | 12/1990 |
| JP | 4-92660 | 8/1992 |
| JP | 2000 114604 A | 4/2000 |
| JP | 2006-210880 | 8/2005 |
| JP | 2008 288540 A | 11/2008 |
| JP | 2009-214387 | 9/2009 |
| JP | 2012-032528 | 2/2012 |
| JP | 2015-219135 A | 12/2015 |
| KR | 10-2012-0012677 A | 2/2012 |
| KR | 10-2016-0003746 | 1/2016 |
| KR | 10-2018-0081905 | 7/2018 |
| TW | 490388 | 6/2002 |
| TW | 201139125 A | 11/2011 |
| TW | 201304208 A | 1/2013 |
| TW | 201327940 A | 7/2013 |

* cited by examiner

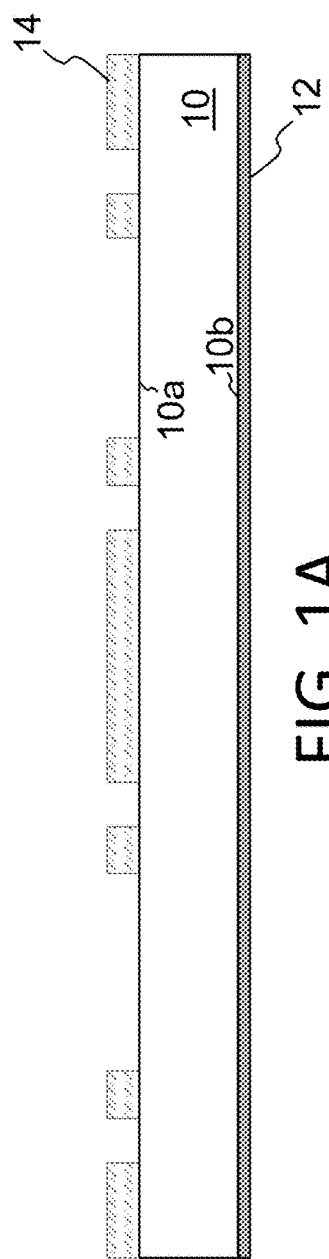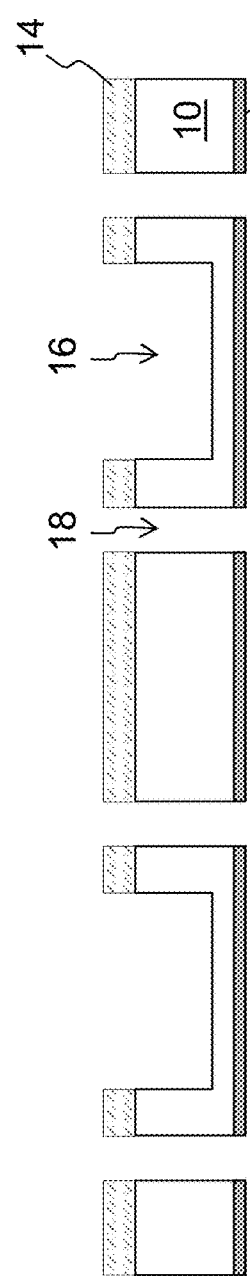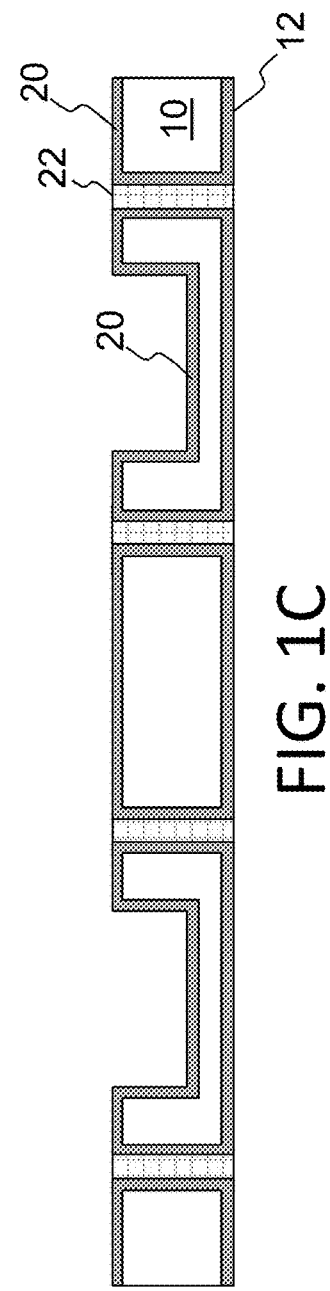

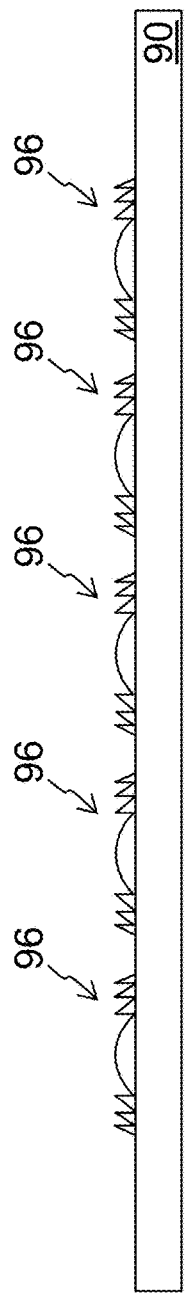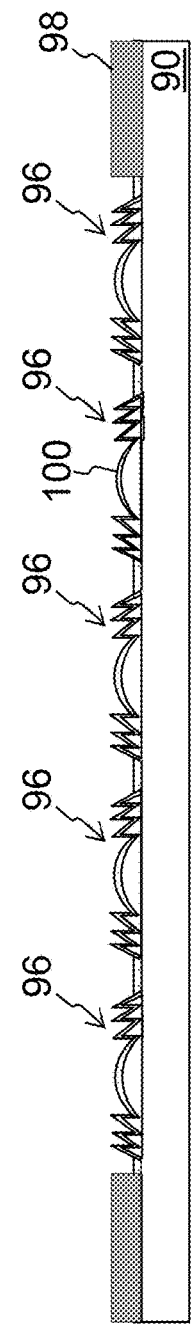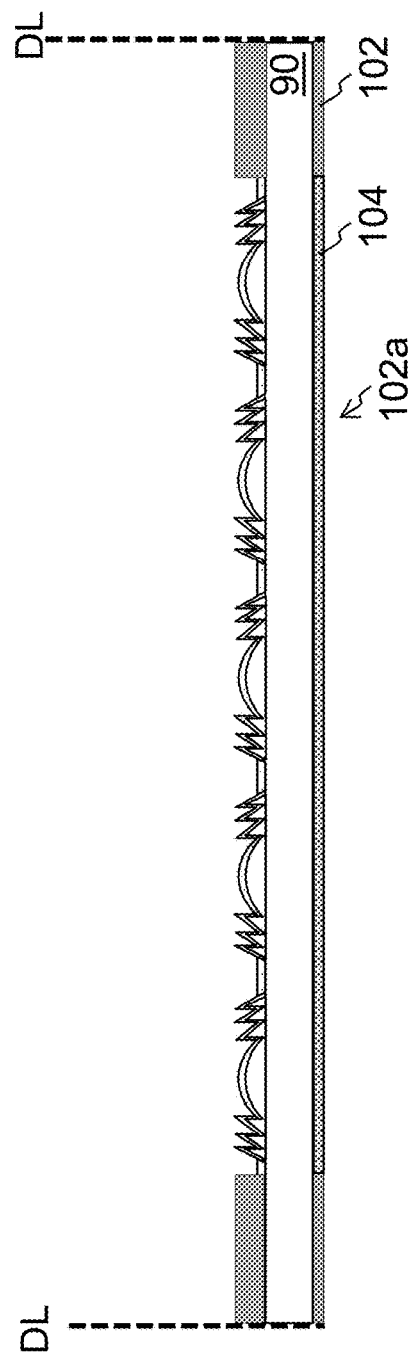

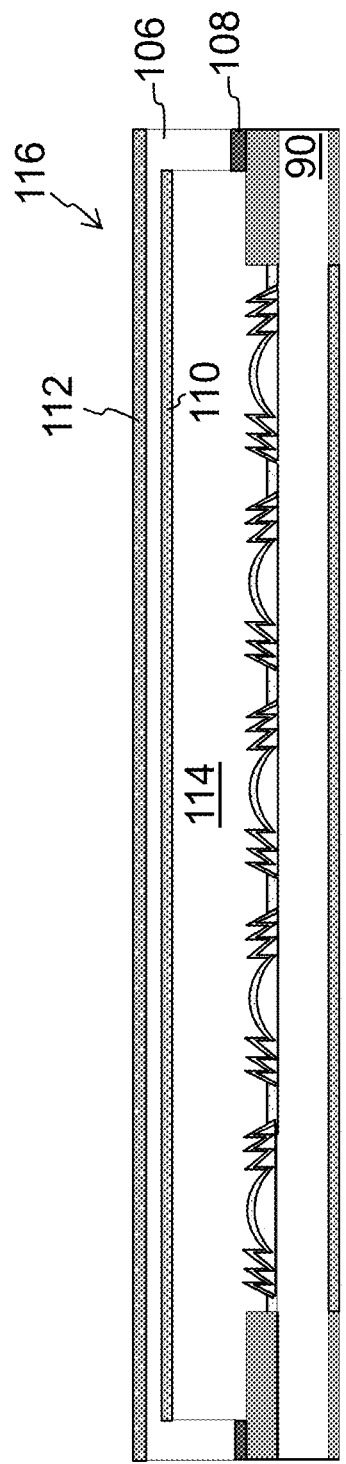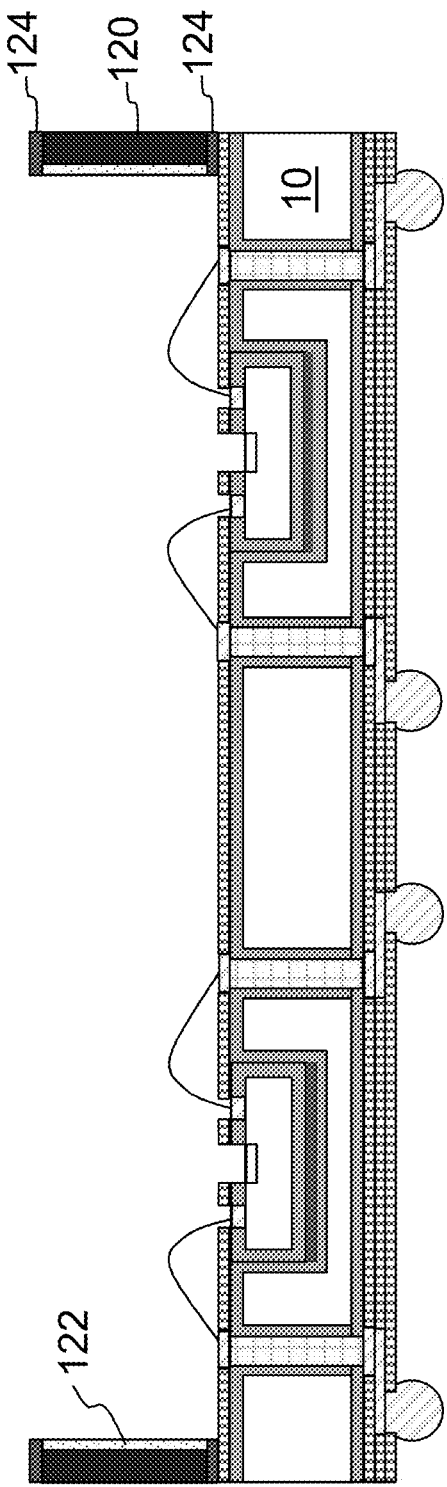

MONOLITHIC MULTI-FOCUS LIGHT SOURCE DEVICE

FIELD OF THE INVENTION

The present invention relates to light emitting devices for use on mobile devices.

BACKGROUND OF THE INVENTION

The present invention relates to ultra-small optical devices and methods of manufacturing integrated optical components for ultra-small optical devices. Specifically, ultra-small light source devices are used in a variety of applications, such as mobile phones. However, designing and manufacturing ultra-small light source devices is challenging because of the complexity involved with integrating ultra-small components used for these devices. Prior art solutions involve complex, multi-lens solutions that are costly, incapable of the desired level of size scaling, and exhibit compromised performance.

The present invention solves these challenges by combining conventional structures with novel components and configurations that together exhibit better performance, provide for better size scaling, cost less to produce, and provide a simpler solution than what is currently available in the art.

BRIEF SUMMARY OF THE INVENTION

The aforementioned problems and needs are addressed by a light source device that includes a light device assembly and a monolithic lens. The light device assembly includes a first substrate with opposing top and bottom surfaces and a plurality of cavities formed into the top surface, a plurality of light source chips each disposed at least partially in one of the plurality of cavities and each including a light emitting device and electrical contacts, and a plurality of electrodes each extending between the top and bottom surfaces and each electrically connected to one of the electrical contacts. The monolithic lens is disposed over the top surface of the first substrate, and includes a unitary substrate with a plurality of lens segments each disposed over one of the light source chips.

Other objects and features of the present invention will become apparent by a review of the specification, claims and appended figures.

BRIEF DESCRIPTION OF THE DRAWINGS

FIGS. 1A-1I are side cross sectional views illustrating the steps in forming a light device assembly.

FIGS. 7A-7F are side cross sectional views illustrating the steps in forming a diffraction lens assembly.

FIGS. 8A-8B are side cross sectional views showing the steps in forming a light source device.

DETAILED DESCRIPTION OF THE INVENTION

Figure 1D:
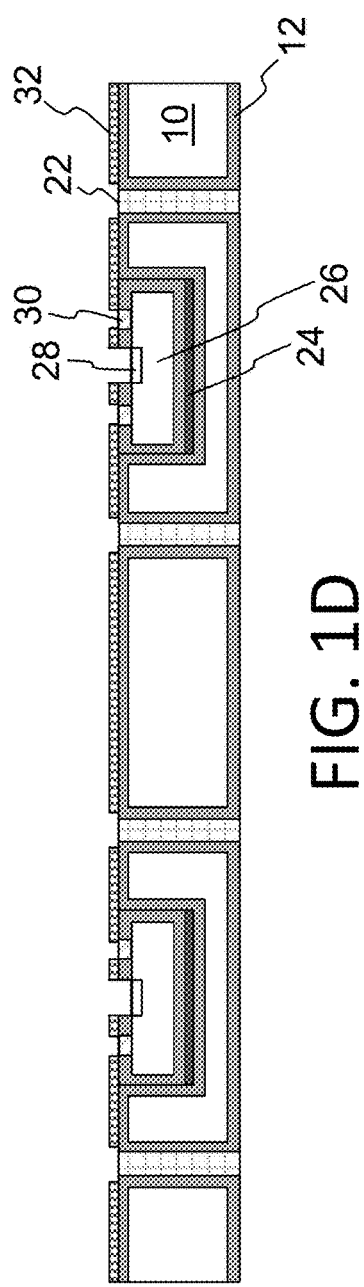

The present invention is light source device with a monolithic lens having multiple lens segments for multiple light source chips, integrated together in a single package. FIGS. 1A-1I illustrate the steps in forming a substrate on which a plurality of light source devices are mounted. The process begins by providing a silicon substrate 10. Silicon wafer thinning can be performed on the substrate 10 by mechanical grinding, chemical mechanical polishing (CMP), wet etching, atmospheric downstream plasma (ADP), dry chemical etching (DCE), or a combination of aforementioned processes or any another appropriate silicon thinning method(s). This step preferably reduces the thickness of silicon substrate 10 to a range of about 50 µm to 500 µm. An insulation layer 12 is formed on the bottom surface 10b of silicon substrate 10. The material of insulation layer 12 can be silicon dioxide (hereinafter "oxide") or silicon nitride (hereinafter "nitride"). Preferably the thickness of insulation layer 12 is greater than 0.5 µm. Insulation layer 12 can be formed by chemical vapor deposition (CVD), plasma-enhanced chemical vapor deposition (PECVD), spin and spray coatings or a combination thereof. Photoresist 14 is formed on the top surface 10a of the substrate 10, selectively illuminated using a mask, and developed whereby portions of the photoresist 14 are selectively removed. Photoresist formation, illumination and selective removal is a well-known photolithographic masking technique for selectively covering some portions of a layer or structure while leaving other portions exposed. The resulting structure is shown in FIG. 1A.

One or more silicon etches are then performed on the portions of the substrate 10 left exposed by the photoresist 14, to form cavities 16 into the top surface 10a of the substrate 10 (which extend into the substrate from the top surface 10a but do not reach the substrate's bottom surface 10b), and to form holes 18 (which extend entirely through the substrate 10), as shown in FIG. 1B. Cavities 16 and holes 18 can be formed using atmospheric downstream plasma (ADP), dry and wet chemical etching, or any other combination of the etching processes. While a single masking step is shown for forming cavities 16 and holes 18, multiple masking steps can be used to separately form cavities 16 and holes 18. The walls of holes 18 are preferably, but need not be, perpendicular to the top and bottom surfaces of substrate 10. After photoresist removal, an insulation layer 20 is formed on the exposed surfaces of the substrate 10, including the substrate's top surface 10a and the surfaces of cavities 16 and holes 18. Insulation layer 20 can be made of oxide, nitride, polymer, polyimide, or a combination of these materials. The thickness of insulation layer 20 is preferably greater than 0.5 µm, and can be formed by chemical vapor deposition (CVD), plasma-enhanced chemical vapor deposition (PECVD), spin and spray coatings or a combination thereof. The holes 18 are then filled with conductive material 22, such as for example Cu, Al, Ti, Cr, Ni or a combination thereof. Conductive material 22 can be formed by metal sputtering, plating, filling with conductive paste or a combination thereof. The conductive material in each hole 18 forms a conductive electrode 22 extending entirely through the substrate 10 The resulting structure is shown in FIG. 1C.

Figure 1E:
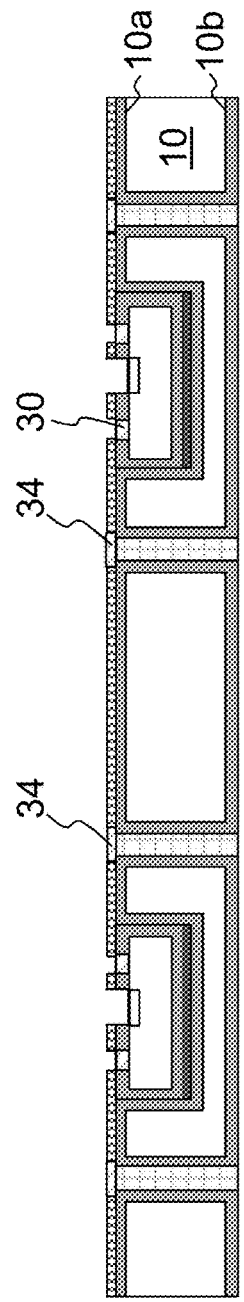
Figure 1F:
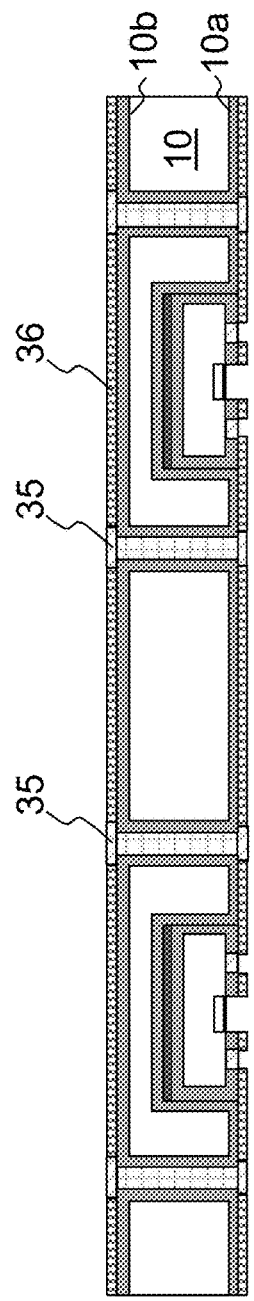

A layer of adhesive 24 is formed on the bottom surface of the cavities 16. Light source chips 26 are then placed in cavities 16, and secured in place by adhesive layer 24. Light source chip 26 is preferably a light emitting semiconductor device containing a light emitting device 28 such as a light emitting diode LED and electrical contacts 30 at the upper surface of light source chip 26 for powering the light emitting device 28. Light emitting device 28 can also be referred to as the active area of the light source chip 26. However, light emitting device 28 can be any appropriate light producing element, such as a vertical cavity surface emitting laser (VCSEL). An insulation layer 32 (e.g., oxide, nitride, polymer, polyimide, etc. preferably with a thickness of at least 0.5 µm) is formed over the top substrate surface 10a, and patterned using a photolithographic masking step to remove portions of the insulation layer 32 to expose the electrical contacts 30 and light emitting device 28 and the tops of electrode 22 in holes 18, as shown in FIG. 1D (after photoresist removal). Photoresist is formed over the top substrate surface 10a, and patterned using a photolithographic masking step to remove portions of the photoresist to expose the tops of electrodes 22 in holes 18. Conductive material (e.g., Cu, Al, Ti, Ni, Cr, etc.) is formed on the exposed tops of electrodes 22 to form conductive bond pads 34, as shown in FIG. 1E (after photoresist removal). An insulation layer 36 (e.g., oxide, nitride, polymer, polyimide, etc. preferably with a thickness of at least 0.5 µm) is formed over the bottom substrate surface 10b, and patterned using a photolithographic masking step to remove portions of the insulation layer 36 to expose the bottoms of electrodes 22 in holes 18. Conductive material (e.g., Cu, Al, Ti, Ni, Cr, etc.) is formed on the exposed bottoms of electrodes 22 to form conductive bond pads 35, as shown in FIG. 1F (after photoresist removal). Formation of bond pads 34 and 35 can be performed by material deposition followed by a selective removal of the deposited material using a photolithographic masking step and etch.

Figure 1G:
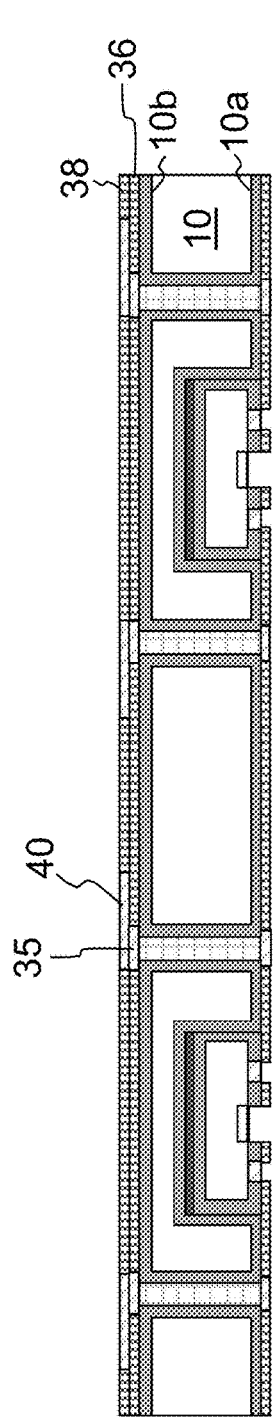
Figure 1H:
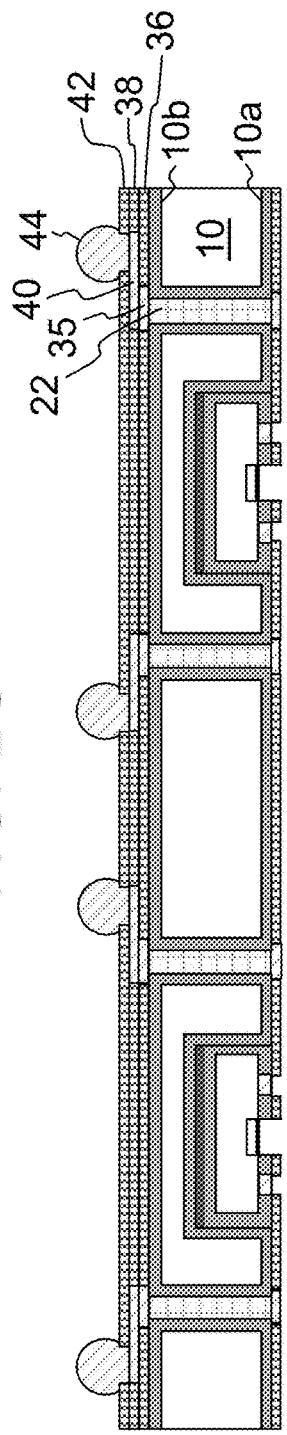

An insulation layer 38 (e.g., oxide, nitride, polymer, polyimide, etc. preferably with a thickness of at least 0.5 µm) is formed on insulation layer 36 and then patterned using a photolithographic masking step to expose bond pads 35 and portions of insulation layer 36 adjacent bond pads 35. Conductive material (e.g., Cu, Al, Ti, Ni, Cr, etc.) is then formed on the exposed bond pads 35 and exposed portions of insulation layer 36 (e.g. by material deposition and selective photolithographic masking step removal) to form redistribution leads 40, as shown in FIG. 1G (after photoresist removal). An insulation layer 42 (e.g., oxide, nitride, polymer, polyimide, etc. preferably with a thickness of at least 0.5 µm) is formed on insulation layer 38 and leads 40, and then patterned using a photolithographic masking step to expose portions of leads 40. Solder ball connectors 44 are formed over the exposed portions of leads 40 as shown in FIG. 1H (after photo resist removal). Solder ball connectors 44 (also commonly referred to as ball grid array BGA) can be formed using a print process or a ball attach process, and can be formed of Pb, Sn, SnCu or any other combination of solder materials. Solder ball connectors 44 serve as re-routed contacts for the electrodes 22 extending through substrate 10 (via bond pads 35 and leads 40).

Figure 1I:
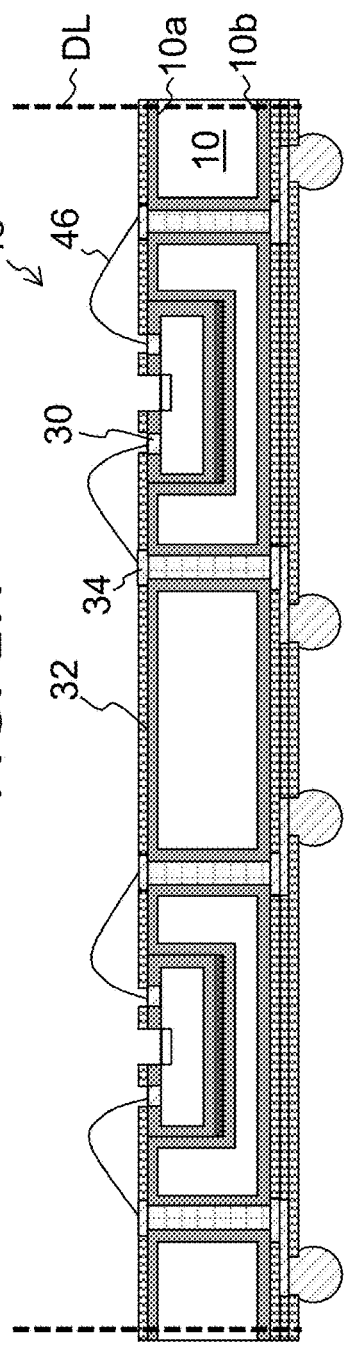
Figure 2:
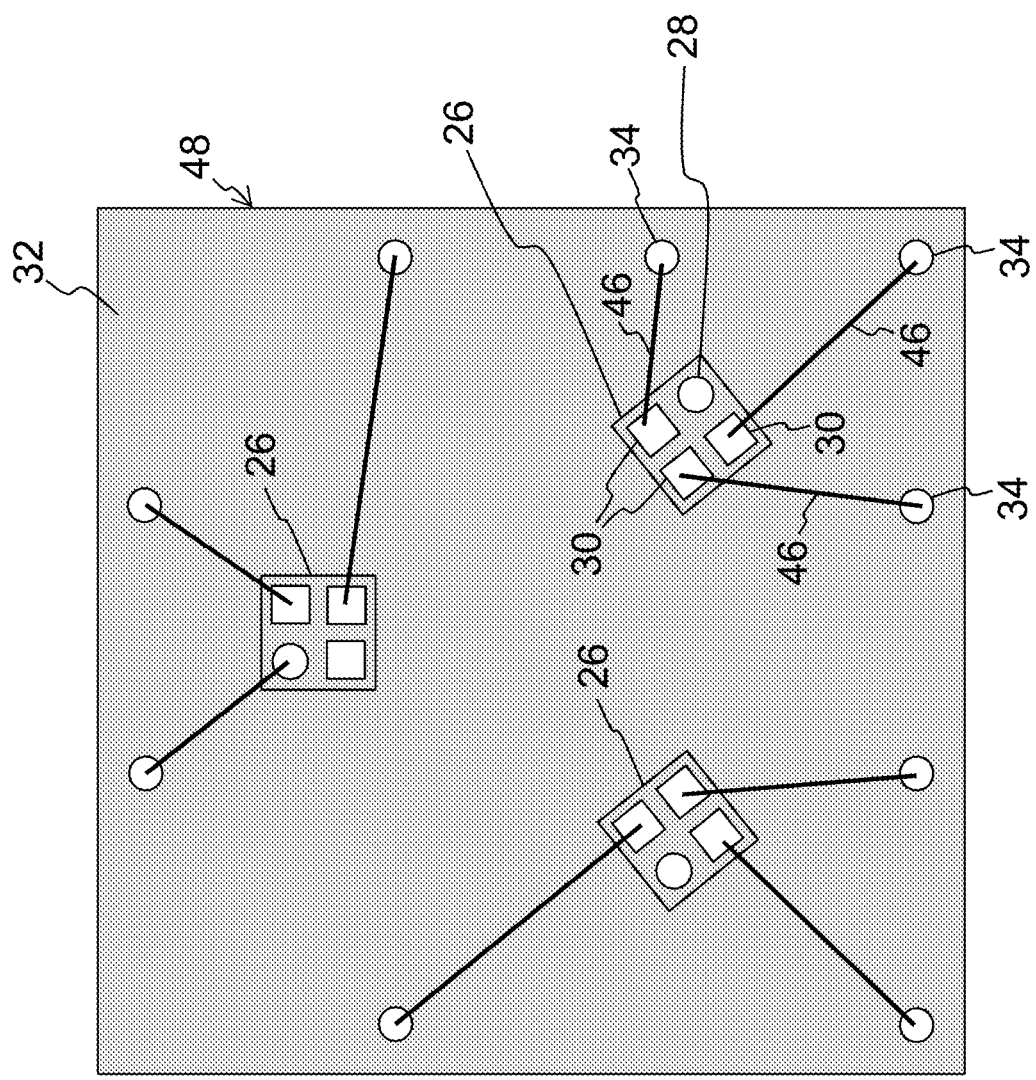
FIG. 2 is a top view of the light device assembly.
Figure 3:
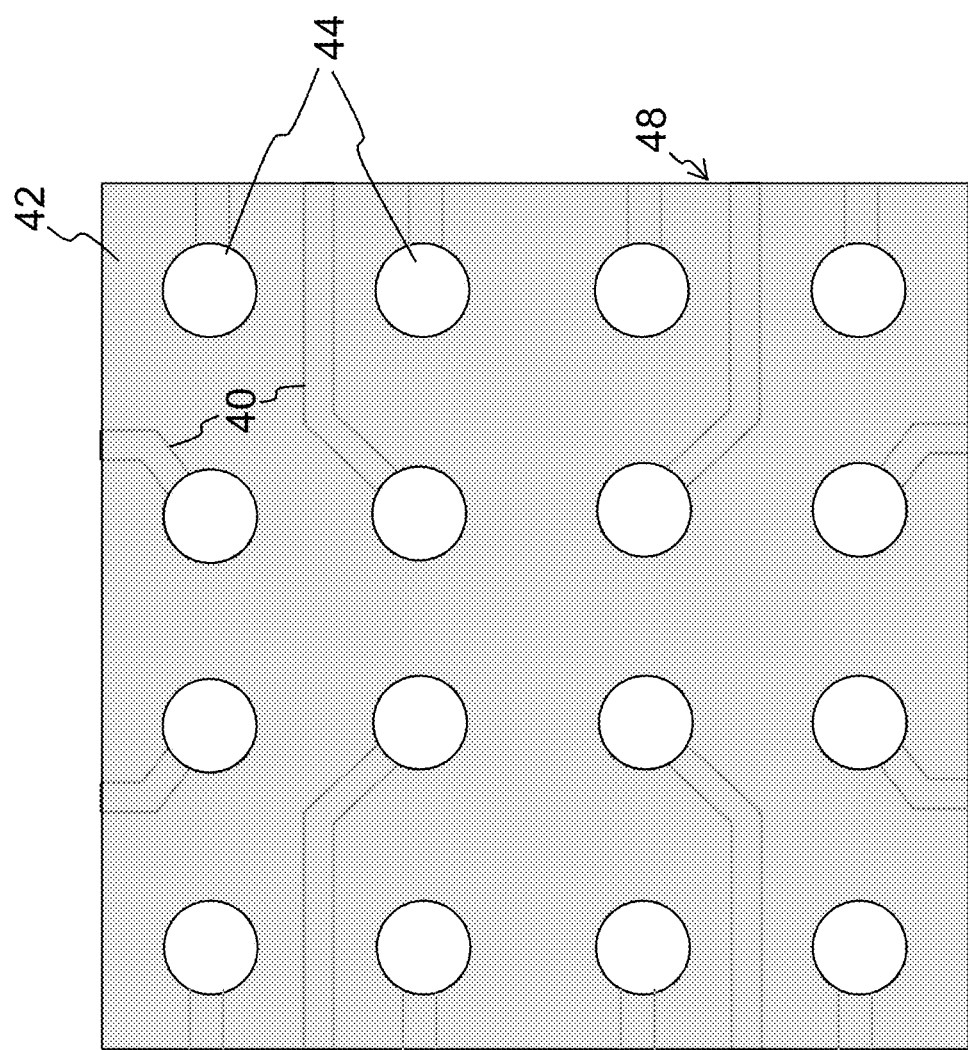
FIG. 3 is a bottom view of the light device assembly.

Wires 46 are connected between the light source electrical contacts 30 and bond pads 34, as shown in FIG. 1I. The material for wires 46 can be Cu, Ag, Au, or any other appropriate material(s). The wires 46 are part of an electrical path from each light source electrical contact 30, through wire 46, bond pad 34, electrode 22, bond pad 35, lead 40 and BGA 44. At this point, the structure can be singulated (diced), where the structure is diced along the dicing lines DL to form a light device assembly 48 as shown in FIG. 1I. Substrate singulation/dicing of components could be done with mechanical blade dicing equipment, laser cutting or any other combination of mechanical and laser processes. Dicing can be performed such that the resulting light device assembly 48 contains just one light source chip 26, or a plurality of the light source chips 26. Moreover, the orientation of the light source chips 26 on the light device assembly 48 can vary depending on the desired light output. For example, FIG. 2 is a top view of a light device assembly 48 containing three light source chips 26 arranged in a triangular spaced relationship. The number and positioning of the light source chips 26 can vary depending on the specific design specifications. FIG. 3 is a bottom view of the light device assembly 48 of FIG. 2, where the solder ball connectors 44 are arranged in a more evenly spaced distribution than the electrical contacts 30 to which they are electrically connected.

Figure 4A:
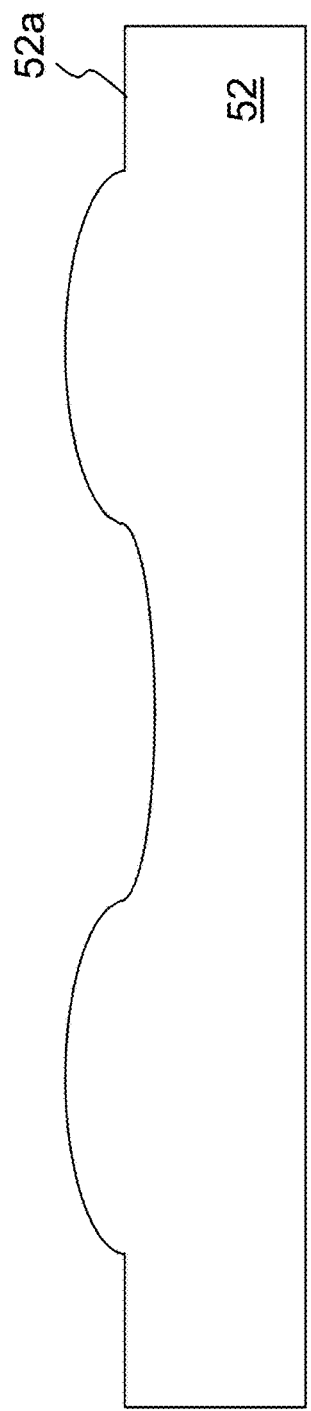
FIGS. 4A-4K are side cross sectional views illustrating the steps in forming a lens assembly.
Figure 4B:
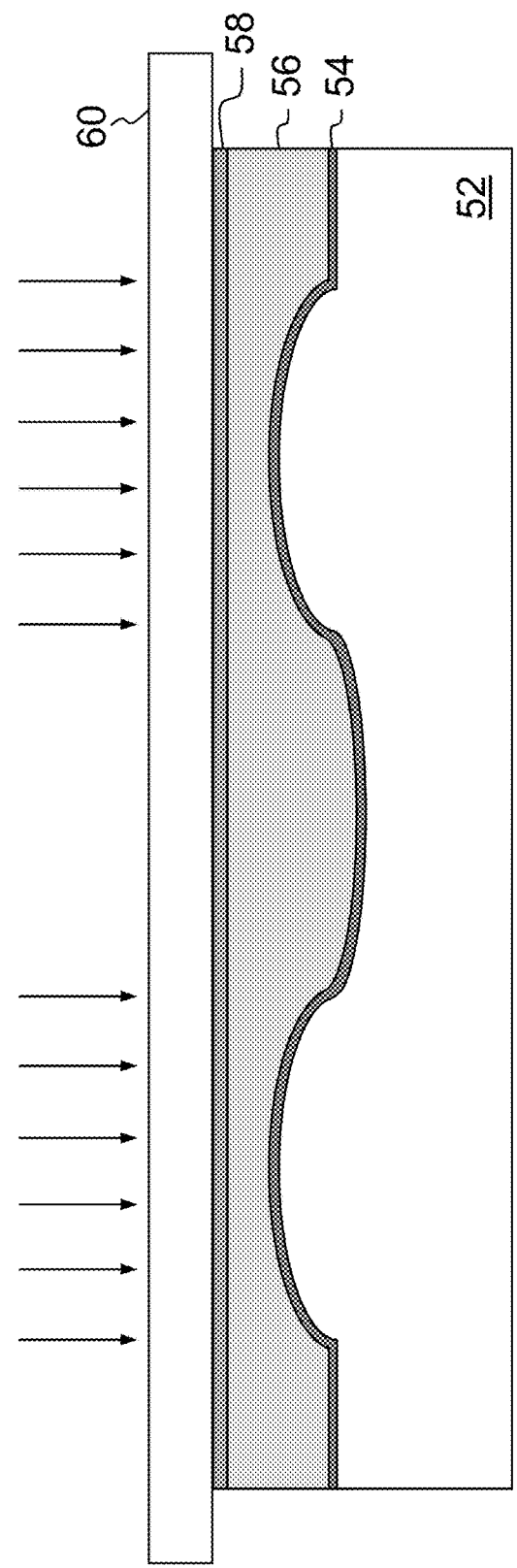

FIGS. 4A-4K illustrate the steps in forming a monolithic multi focus lens for the above described light device assembly 48. The process begins with a first master mold 52 which has an upper surface 52a shaped with a pattern that matches that of the desired shape of the finished lens, as shown in FIG. 4A. The master mold 52 can be formed using photolithographic and etching techniques, or mechanical diamond tool patterning, both of which are known in the art. A layer of metal 54 is preferably formed on the shaped upper surface 52a of the master mold 52 (to prevent the subsequently formed polymer from sticking to the master mold upper surface 52a). A layer of polymer 56 is formed on the metal layer 54, and an adhesive layer 58 is formed on the polymer layer 56. A carrier mold 60 is mounted to the polymer layer 56 by adhesive 58. The polymer layer 56 is preferably made of a resin, polydimethylsiloxane (PMDS), cyclo-olefin polymer (COP), polymethyl methacrylate (PMMA) or any other appropriate material. The adhesive layer 58 is preferably made of an optically transparent or UV curable material. The carrier mold 60 can be a soft mold or a metal mold. The polymer layer 56 can be fixed into its designed pattern by thermal curing or light curing, as shown in FIG. 4B.

Figure 4C:
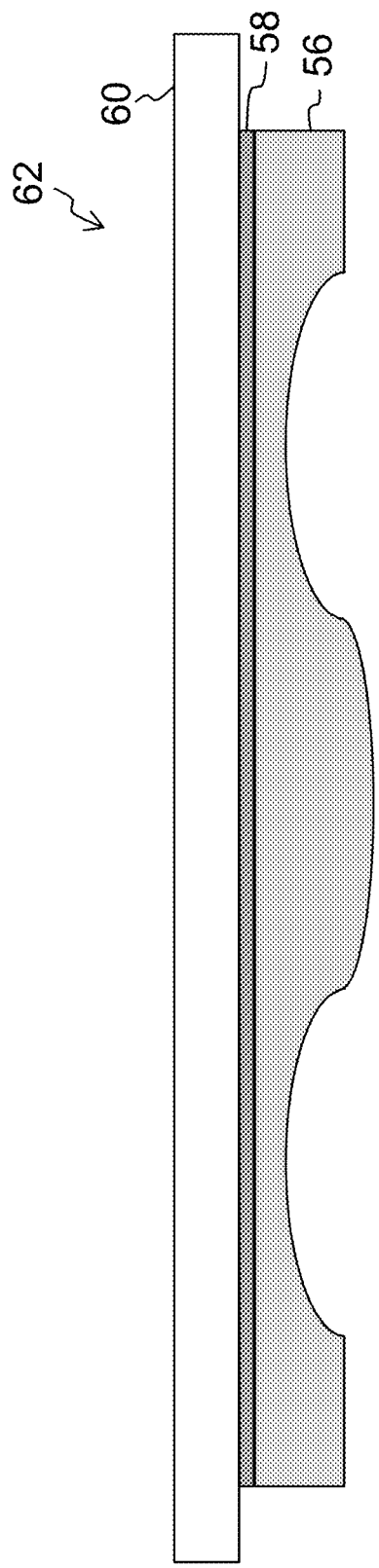
Figure 4D:
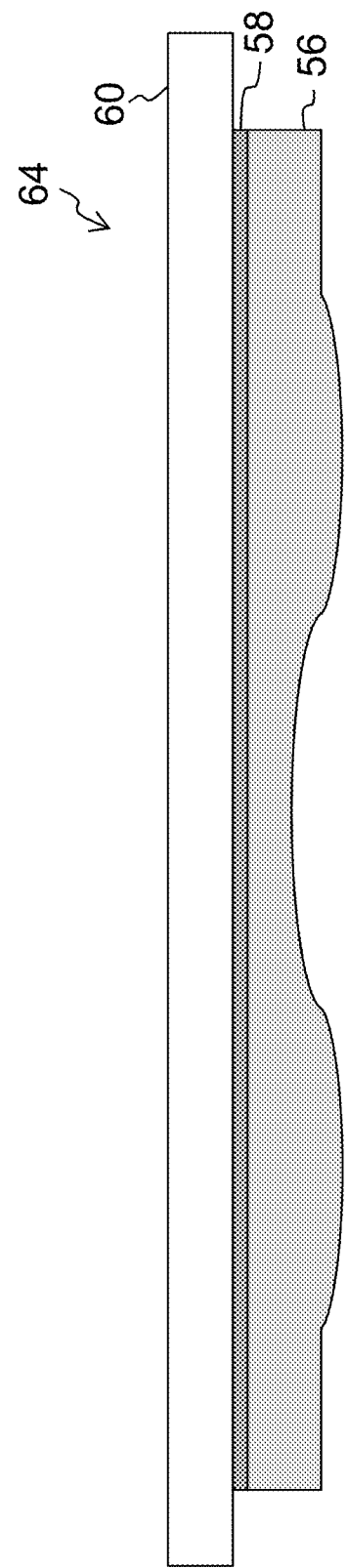
Figure 4E:
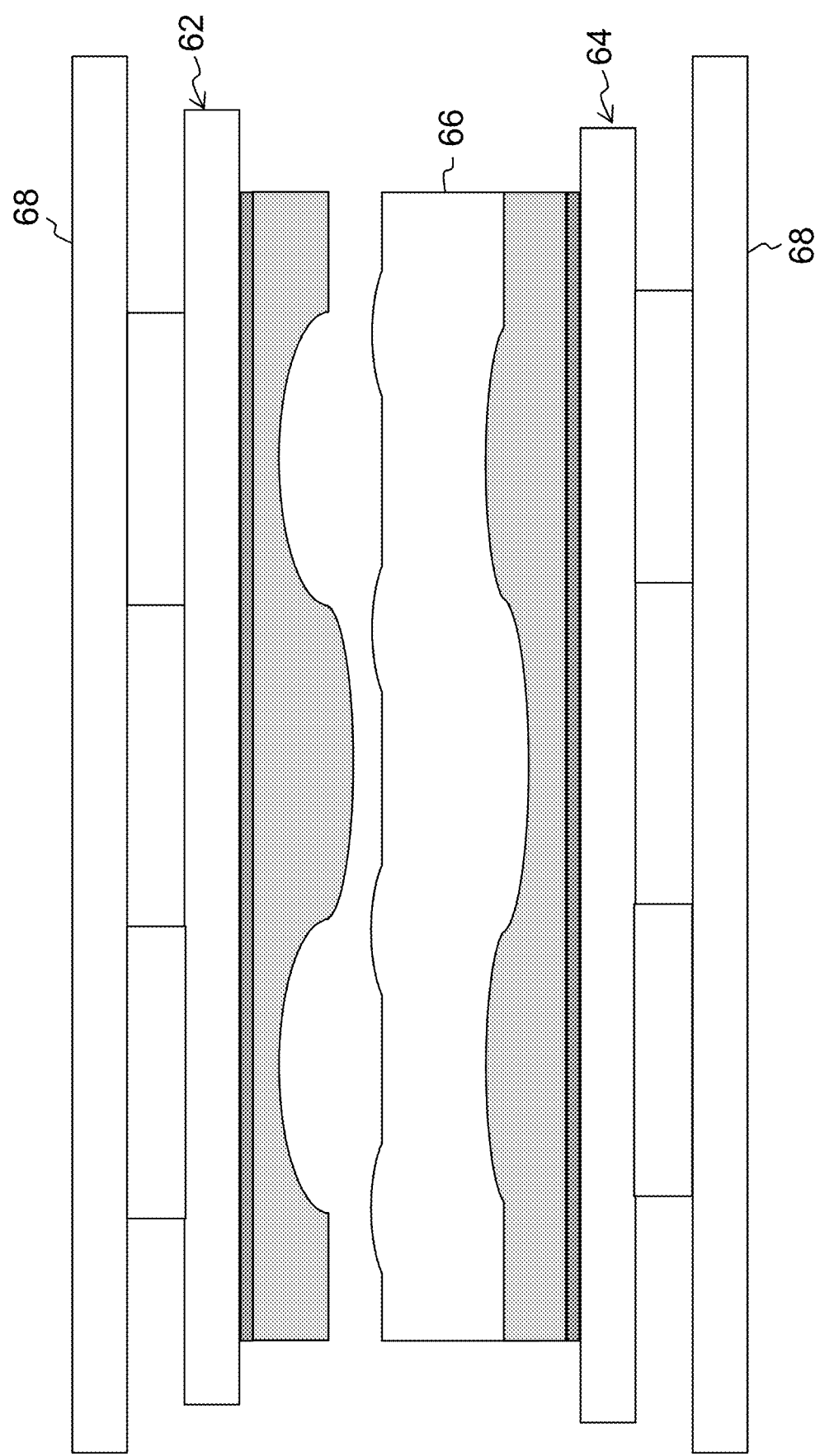
Figure 4F:
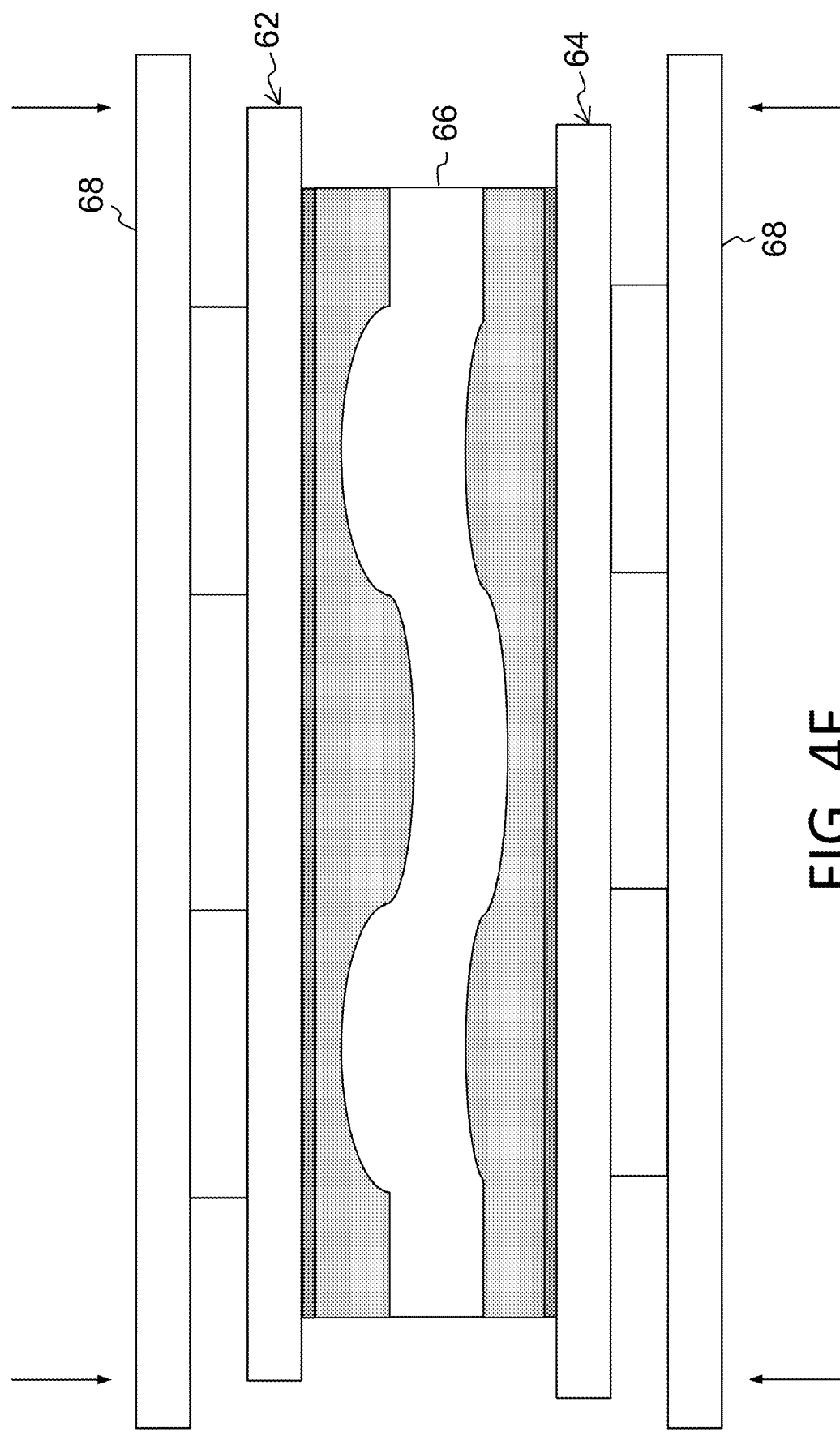
Figure 4G:
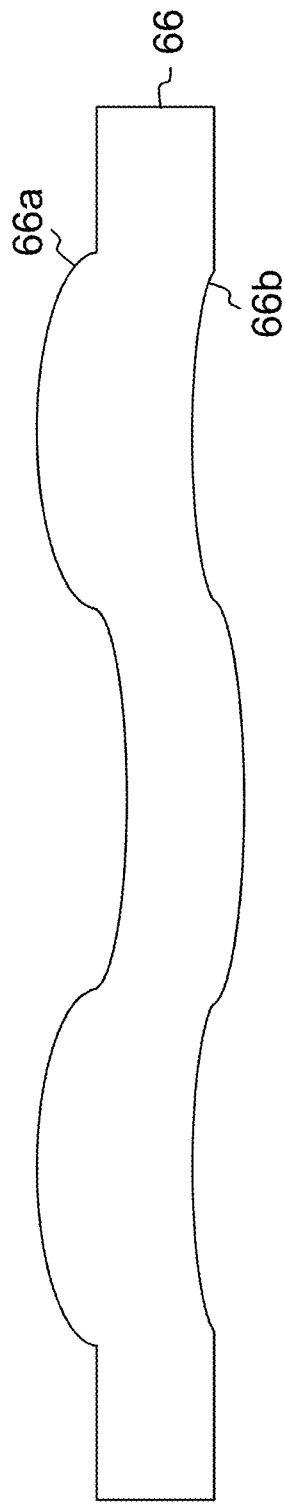
Figure 4H:
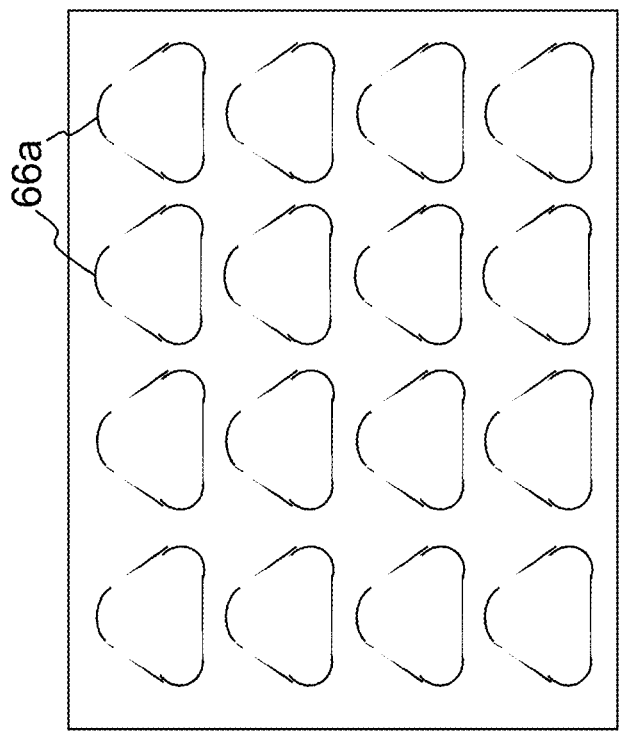

The master mold 52 and metal layer 54 are removed, leaving a top lens replica assembly 62, as shown in FIG. 4C. A bottom lens replica assembly 64 (having its polymer layer 56 with a surface curvature matching that of the desired bottom surface of the lens) is formed in the same manner as top lens replica assembly 62, and is shown in FIG. 4D. A polymer layer 66 is dispensed onto one of the top and bottom lens replica assemblies 62/64, which are then mounted to a stamper assembly 68 whereby they are positioned and aligned facing each other, as shown in FIG. 4E. The polymer layer 66 can be dispensed from a nozzle and spun into the designed thickness. The polymer layer 66 is preferably a resin, polydimethylsiloxane (PMDS), cyclo-olefin polymer (COP), polymethyl methacrylate (PMMA) or any other transparent material(s) appropriate as a lens material. Contact aligners, proximity aligners, scanning projection aligners or other appropriate alignment method(s) can be used to align the replica assemblies 62/64 to each other. The stamper assembly 68 then presses the replica assemblies 62/64 together with the desired pressure and at the desired temperature so that the polymer layer 66 conforms to (and is cured to) the shapes of the polymer layers 56 of the assemblies 62/64, as shown in FIG. 4F. This pressing process can be performed as a single step, or in multiple steps separately applying pressure to one of the replica assemblies 62/64 one at a time. The polymer layer 66 is then extracted (as a unitary substrate having the desired upper and lower shaped surfaces 66a/66b), as shown in FIG. 4G. As shown in the top view of FIG. 4H, multiple lens shapes can be formed in a single lens substrate 66, which is later diced/singulated to form a plurality of individual lenses, with each individual lens including a plurality of lens segments 84 described in further detail below.

Figure 4I:
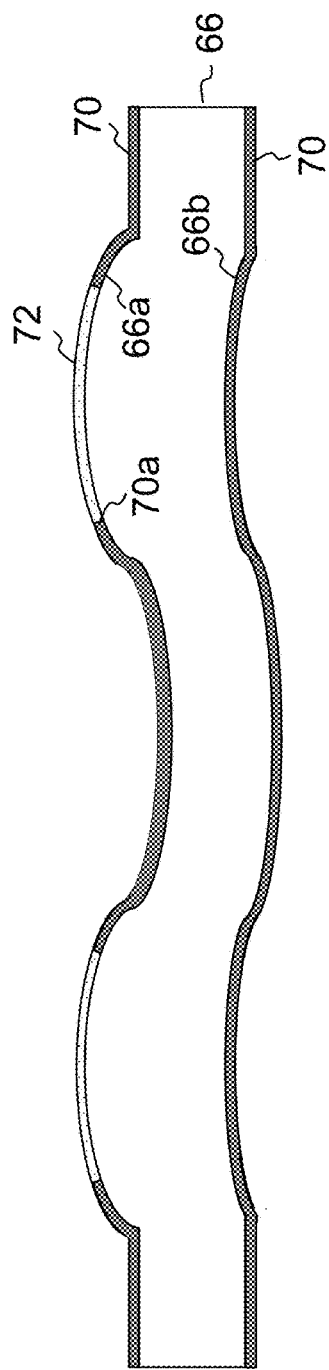
Figure 4J:
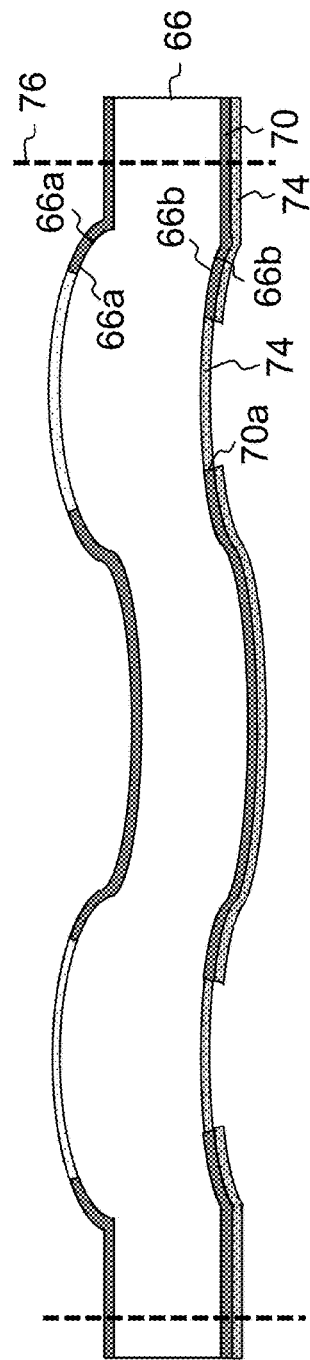
Figure 4K:
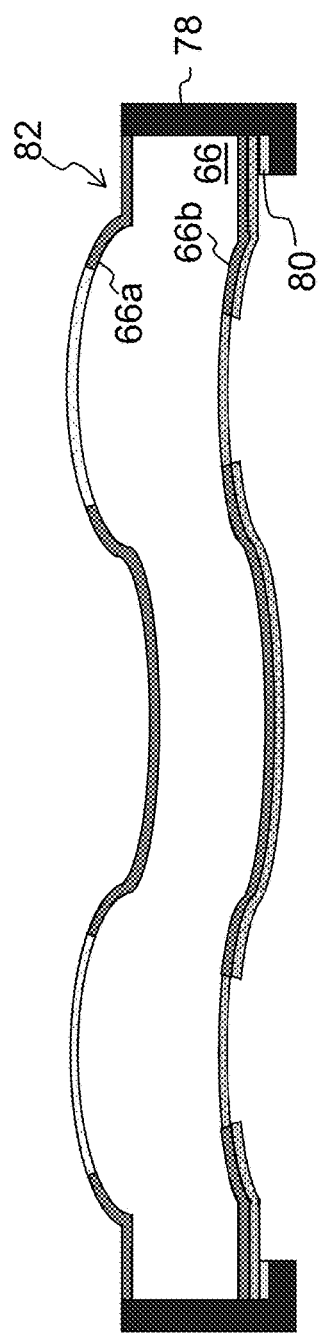

A metal layer 70 is formed on both upper and lower surfaces 66a/66b of lens substrate 66, and can include one or more of Cu, Ti, and Al. The metal layer 70 on the upper surface 66a is then patterned (e.g., a photolithographic masking step and metal etch) to create apertures 70a in the metal layer 70 that expose portions of the underlying lens substrate 66. A layer of filter material 72 is then formed on the exposed portions of the lens substrate 66. The filter material is preferably a material that filters infrared light, such as magnesium fluoride (MgFl), N-BK7, or cadmium telluride (CdTe), which can be formed by Chemical Vapor Deposition (CVP), ion beam assisted deposition or any other appropriate deposition method(s). The resulting structure is shown in FIG. 4I (after removal of the photoresist used for the photolithographic masking step). The metal layer 70 on the lower surface 66b is then patterned (e.g., a photolithographic masking step and metal etch) to create apertures 70a that expose the underlying lens substrate 66. After photoresist removal, a layer of anti-reflection material (AR coating 74) is formed over the lower surface 66a, including directly on the exposed portions of lens substrate 66 in aperture portions 70a of the metal layer 70, as shown in FIG. 4J. If more than one lens is being formed at the same time, then lens substrate 66 can be diced/singulated into the desired size and shape, for example, on the dicing lines 76 of FIG. 4J. The diced/singulated lens substrate 66 can then be mounted to a lens holder 78 using adhesive 80. Preferably, lens holder 78 is made of a non-transparent material such as non-transparent silicon. The resulting finished lens assembly 82 is shown in FIG. 4K.

Figure 5A:
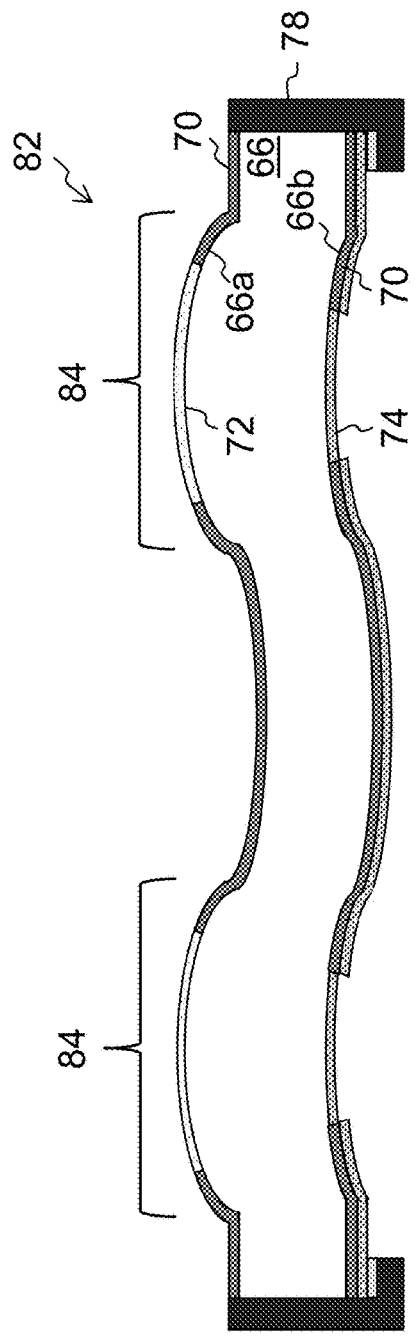
FIGS. 5A and 5B are side cross sectional and top views of the lens assembly.
Figure 5B:
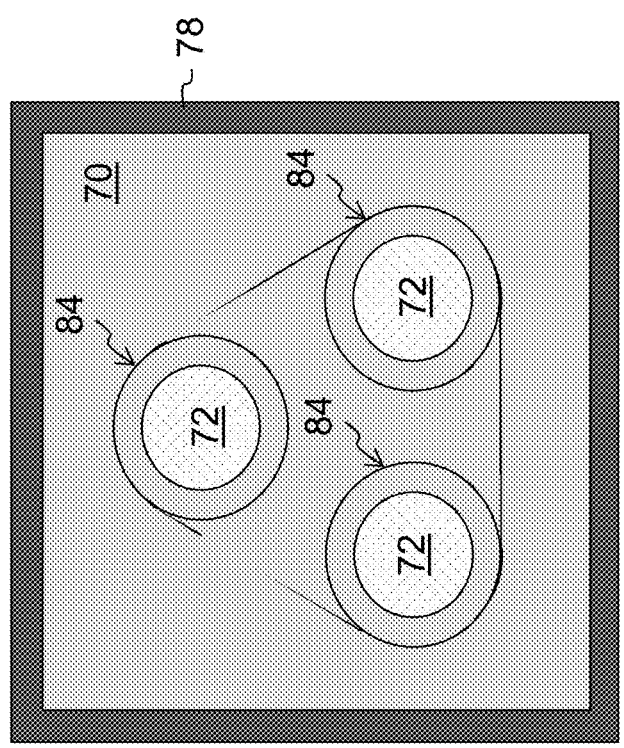
Figure 6:
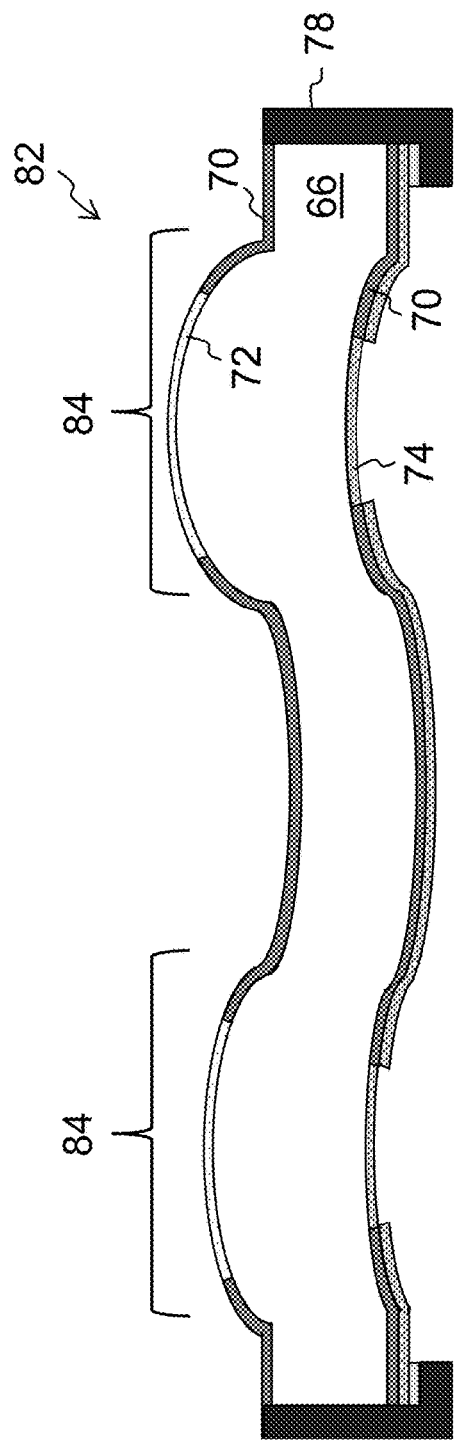
FIG. 6 is a side cross sectional view of the lens assembly having varying lens segment designs.

FIGS. 5A and 5B are side and top views of the finished lens assembly 82. In this non-limiting example, the lens substrate 66 is unitary (continuous) and has three lens segments 84. However, the number of lens segments 84 in the lens assembly 82 can vary. All the lens segments 84 in the lens assembly 82 are shown to have the same focal properties (i.e. focal distance, optical focusing/dispersion properties, etc.). However, the focal properties between lens segments in the same lens assembly 82 can be varied. For example, FIG. 6 illustrates a lens substrate 66 where the shapes and therefore focal properties of the lens segments 84 differ from each other. Apertures 70a in each lens segment 84 allow light to pass through the lens segment.

Figure 7A:
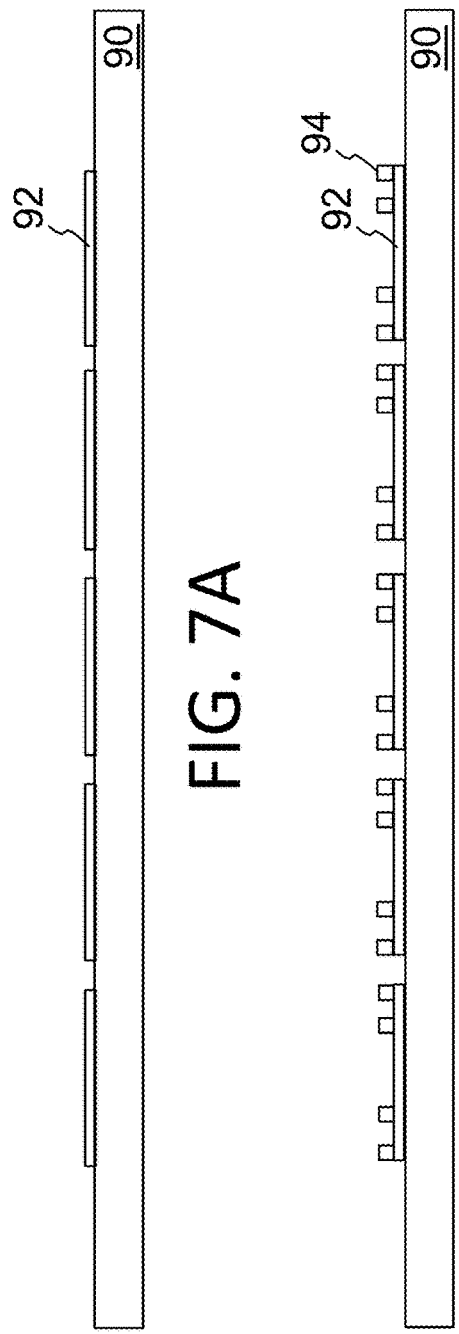
Figure 7B:
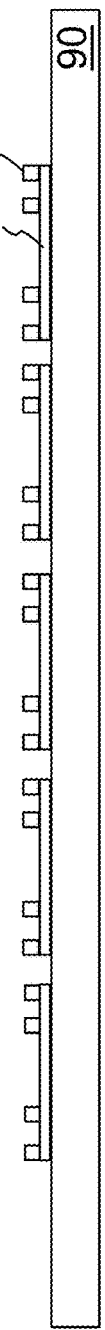

FIGS. 7A-7F illustrate the steps in forming a micro lens array for the above described monolithic multi focus lens 82 and multi light source device substrate 10. The process begins with a substrate 90 made of a transparent material such as glass. The substrate can be thinned by mechanical grinding, chemical mechanical polishing (CMP), wet etching, atmospheric downstream plasma (ADP), dry chemical etching (DCE), or a combination thereof. A patterned layer of polymer 92 is formed on the upper surface of the substrate 90. For example, polymer layer 92 can be formed by forming and patterning photoresist using a photolithography masking process, and forming/curing polymer on the portions of substrate 90 left exposed by the photoresist. The resulting structure is shown in FIG. 7A (after photoresist removal). The lithography/polymer process is repeated to form a second patterned layer of polymer 94 on polymer layer 92, as shown in FIG. 7B (after photoresist removal). The process is repeated again many times, until the desired micro lenses 96 of polymer of desired shape (e.g., a diffractive pattern) are formed on substrate 90, as shown in FIG. 7C.

A photolithography masking process is performed to cover the micro lenses 96 with photoresist, but leave the adjacent area of substrate 90 exposed. A metal layer 98 is formed on the exposed portions of the substrate 90. After photoresist removal, an optical coating 100 can be deposited on the micro lenses 96, as shown in FIG. 7D. Optical coating 100 is preferably a material that filters out infra-red light, such as magnesium fluoride (MgFl), N-BK7, cadmium telluride (CdTe) or any other appropriate IR filtering materials. A metal layer 102 is formed on the bottom surface of substrate 90, and patterned using a photolithography masking process and metal etch, so that the metal layer 102 includes an aperture 102a underneath micro lenses 96. An optional anti-reflective coating 104 can be formed on the bottom surface of the substrate 90 in aperture 102a, as shown in FIG. 7E. The material for coating 104 can be magnesium fluoride (MgFl), or any other appropriate anti-reflective coating material. At this point, a plurality of the structures in FIG. 7E are formed on a common substrate 90. Preferably, the substrate 90 is singulated (diced) at this point along dicing lines DL. A transparent substrate 106 is mounted to the metal layer 98 and over the micro lenses 96, by adhesive 108, as shown in FIG. 7F. Substrate 106 can be plastic, glass, or any other appropriate transparent material. The surface of substrate 106 facing the micro lenses 96 can include an optional anti-reflective coating 110, and the opposite surface of substrate 106 can include an optional infrared filter coating 112. The substrate 106 preferably includes a cavity 114 so that substrate 106 does not interfere with micro lenses 96. The final diffraction lens assembly 116 is shown in FIG. 7F.

Figure 8B:
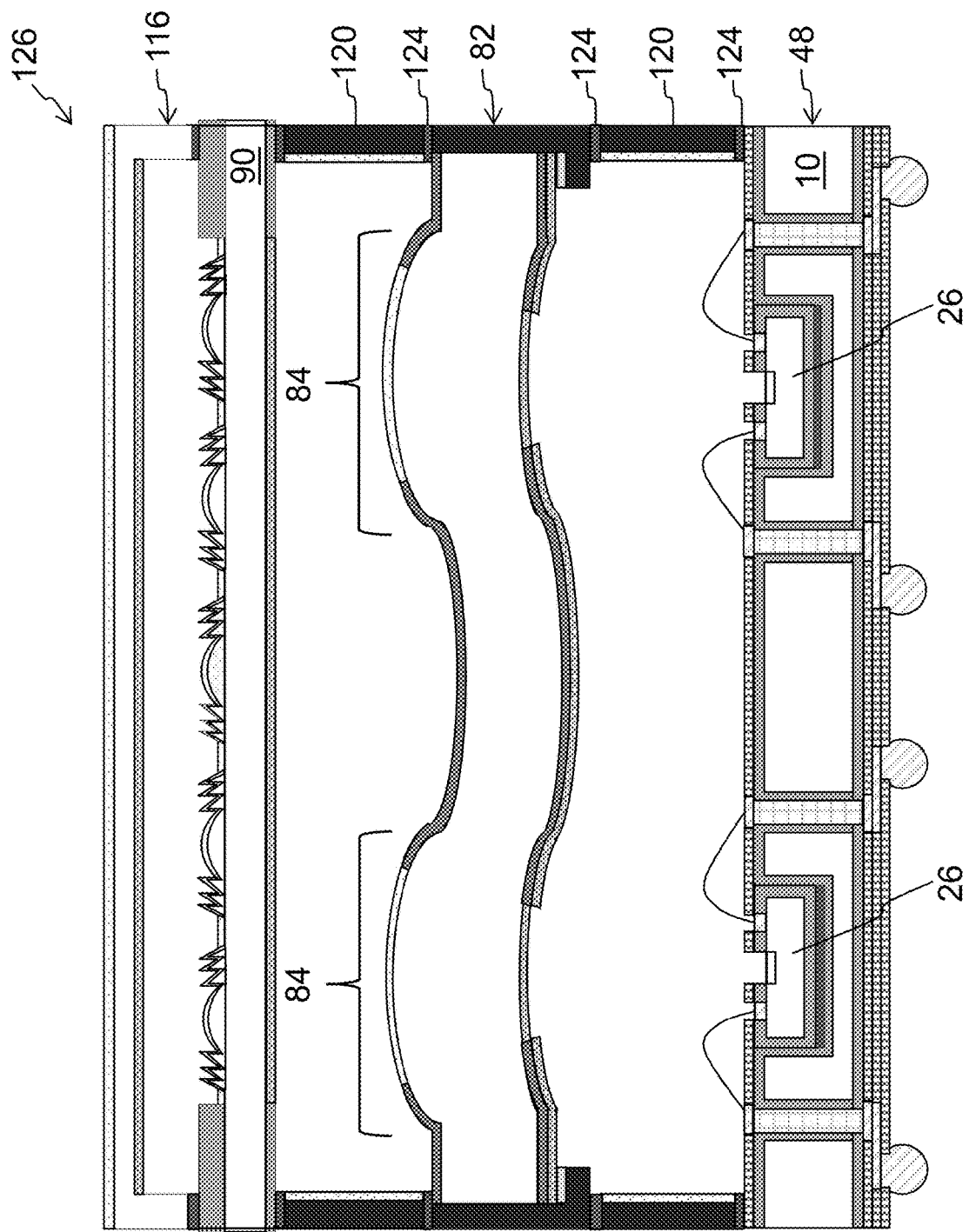

A spacer 120 is mounted to substrate 10 using an adhesive material 124, as shown in FIG. 8A. Spacer 120 is preferably made of a rigid material that does not transmit light, and has a low coefficient of thermal expansion (CTE) or a CTE that matches that of the substrate 10. Preferably, spacer 120 is non-transparent silicon or glass. However, spacer 120 could also be formed of metal. Spacer 120 can be formed by etching a square or other shaped aperture through a silicon substrate using a photolithographic masking and etch process. An optional light reflective coating 122 can be formed on the interior sidewalls of spacer 120. The previously described lens assembly 82 is mounted on spacer 120 so that each lens segment 84 is disposed over one of the light source chips 26 for focusing the light therefrom. A second spacer 120 is mounted on lens assembly 82. Diffraction lens assembly 116 is mounted to the second spacer 120. The final light source device 126 is shown in FIG. 8B.

Figure 9:
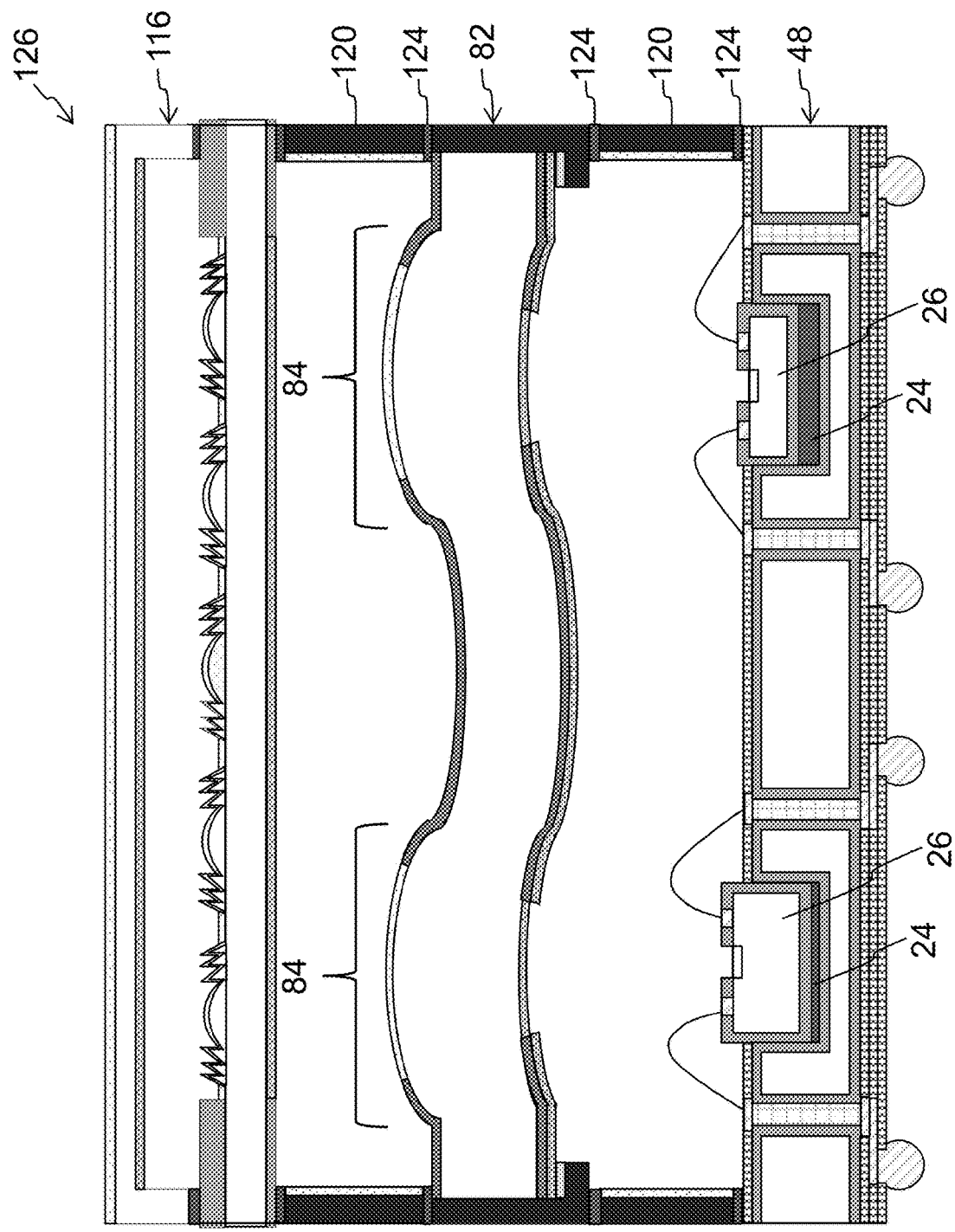
FIG. 9 is a side cross sectional view illustrating light source chips and/or their adhesive layers having different thicknesses.

Light source device 126 integrates light sources and their respective optical elements in unique way and provides many advantages. Device 126 provides a compact, sealed enclosure assembly protecting, among other things, light source chips 26, lens segments 84 and micro lenses 96. Light source device 126 utilizes a monolithic lens, integrates it components in a thin package in a highly accurate way yet reduces cost. The electrical connections to the light source chips 26 are routed through the substrate 10 and to its bottom surface, where they are rerouted to solder ball connectors 44. Each lens segment 84 is disposed over and precisely aligned with one of the light source chips 26. Cavities 16 provide high precision positioning of the light source chips 26 both in the x and y (lateral) directions and in the z (depth) direction. The light focal distance between each light source chip 26 and its lens segment 84 can be precisely controlled (e.g. by spacer 120) to produce the desired light output, and can be varied. For example, the thickness of the light source chip 26 can vary, and/or the thicknesses of adhesive 24 can vary, so that the distances between the light source chips 26 and their corresponding lens segments 84 can vary within the same light source device 126, to produce the desired total light output characteristics from the light source device 126 as a whole. See for example FIG. 9, where the two light source chips have different thicknesses, as do the adhesive 24 underneath. Alternately or additionally, the focal properties of lens segments 84 in the same device 126 can vary to provide the desired light output. This means that each light source chip 26 and its lens segment 84 can produce a light output different from that from the other light source chips and lens segments, whereby the combined light outputs can produce a uniquely designed overall light output that cannot be achieved with a single light source. For example, one light source chip 26 and its lens segment 84 can be configured to maximize even illumination of an area closer to the device 126, while one or more of the light source chips 26 and their lens segment 84 can be configured to maximize even illumination of an area further away from the device 126. As another example, different light source chips 26 and lens segments 84 can be configured to illuminate different spatial areas relative to the device 126.

Forming spacers 120 of opaque material and/or including reflective coating 122 blocks any light from the outside and prevents any light leakage from device 126, thus improving light efficiency. Anti-reflective coatings reduce optical loss and increase efficiency. Optical coatings 72 and 100 can be used to block unwanted wavelengths from the optical output of the device 126, such as infrared light. The diffractive optical pattern of micro lenses 96 provides the desired diffraction of the output for even or non-even light distribution as needed. Light from different light source chips 26, using lens segments 84 with uniform or varying focal properties, to illuminate the micro lenses 96 provides the versatility to provide any desired light output pattern. Forming micro lenses 96 using optically transparent polymer material through a lithography process on the surface of substrate 90 (as opposed to the conventional technique of etching diffraction patterns into a surface of a substrate) reduces cost and increases consistency, reliability and the ability to achieve the desired performance. Moreover, parameters such as focal length and lens diameter of the diffractive pattern micro lens array are flexible and tunable directly by software.

The light source device 126 is ideal for many applications. For example, facial recognition used to unlock cell phones would benefit greatly from the invention. One challenge is how best to illuminate the user's face in the three dimensional space in front of the mobile phone's camera for capturing details of the user's face, given that different users hold their mobile phone differently. The present invention would use different light source chip and lens segment combinations to illuminate different regions of that three dimensional space. Specifically, one light source chip and its lens segment can be configured to best illuminate a region closer to the camera, while another light source chip and its lens segment can be configured to best illuminate a region further away from the camera, and so on. Any number of light source chip and lens segment combinations can be used to target different regions of the three dimensional space. Another ideal application can be particle detection, where different regions of a three dimensional space are illuminated by different light source chip and lens segment combinations so that particles in the three dimensional space can be optically detected. Other applications can include automobiles, home, TV, or any other application in which precise and accurate illumination of a two dimensional or three dimensional space is needed.

Multiple, separate, light source devices 126 can be included in the same application device (i.e., cell phone, camera, automobile, home appliance, TV, etc.), where the various light source devices 126 in any given single application device can either be the same or can be different from each other in terms of size, design and/or functionality). For example, a light source device 126 operating in the visible region and a light source device 126 operating in the non-visible spectrum can be included in the same application device. In addition or alternately, a single light source device 126 can include light source chips 26 that vary in size, design and functionality. For example, a single light source device 126 can include a first light source chip 26 that generates visible light and a second light source chip 26 that generates invisible light (e.g., UV or IR).

Figure 10:
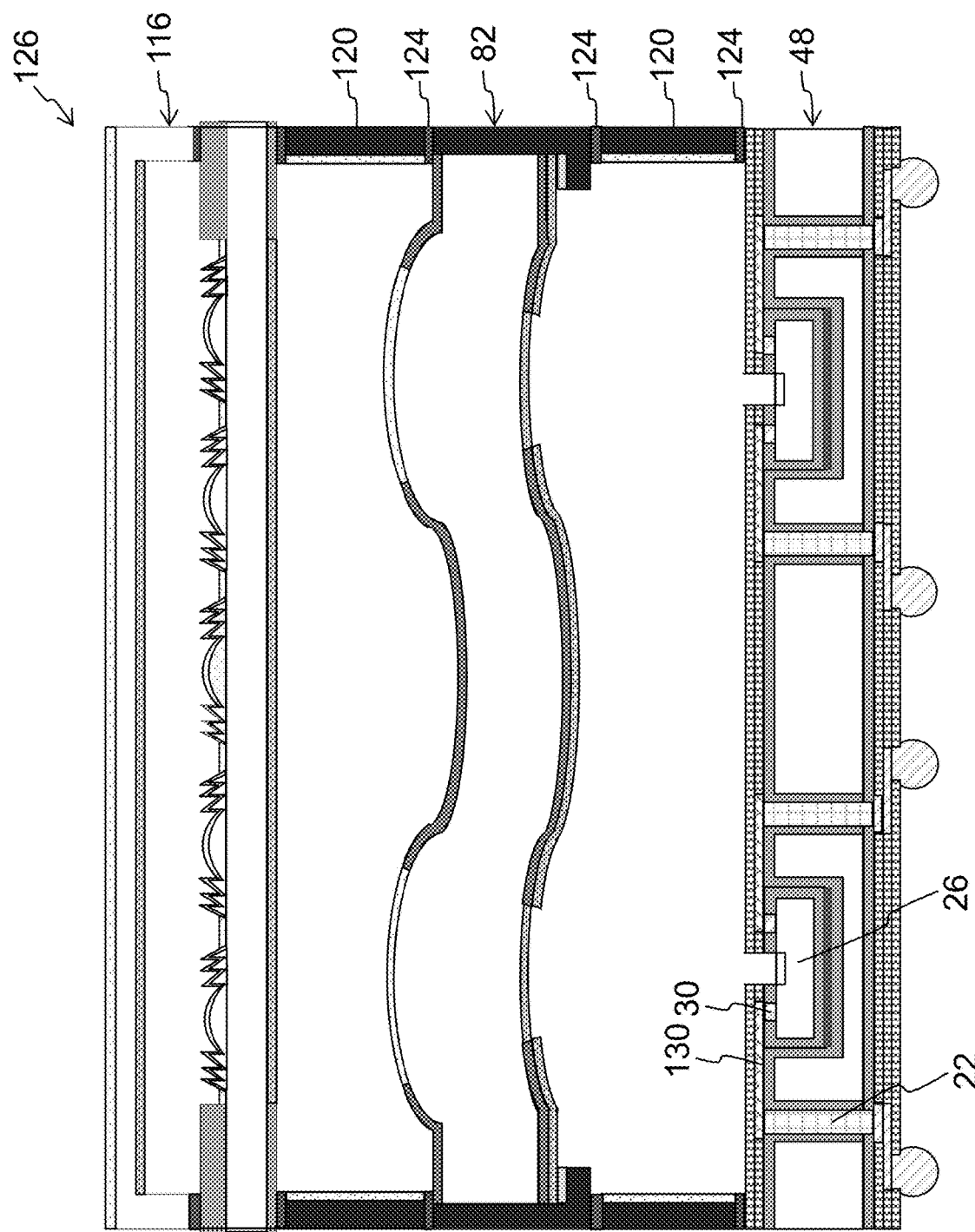
FIG. 10 is a side cross sectional view of a first alternate embodiment of the light source device.

FIG. 10 illustrates a first alternative embodiment, where the electrical contacts 30 of the light source chips 26 are electrically connected to the conductive electrodes 22 in substrate 10 by conductive traces 130 instead of by wires 46. Conductive traces 130 can be formed by forming and patterning a layer of conductive material on substrate 10.

Figure 11:
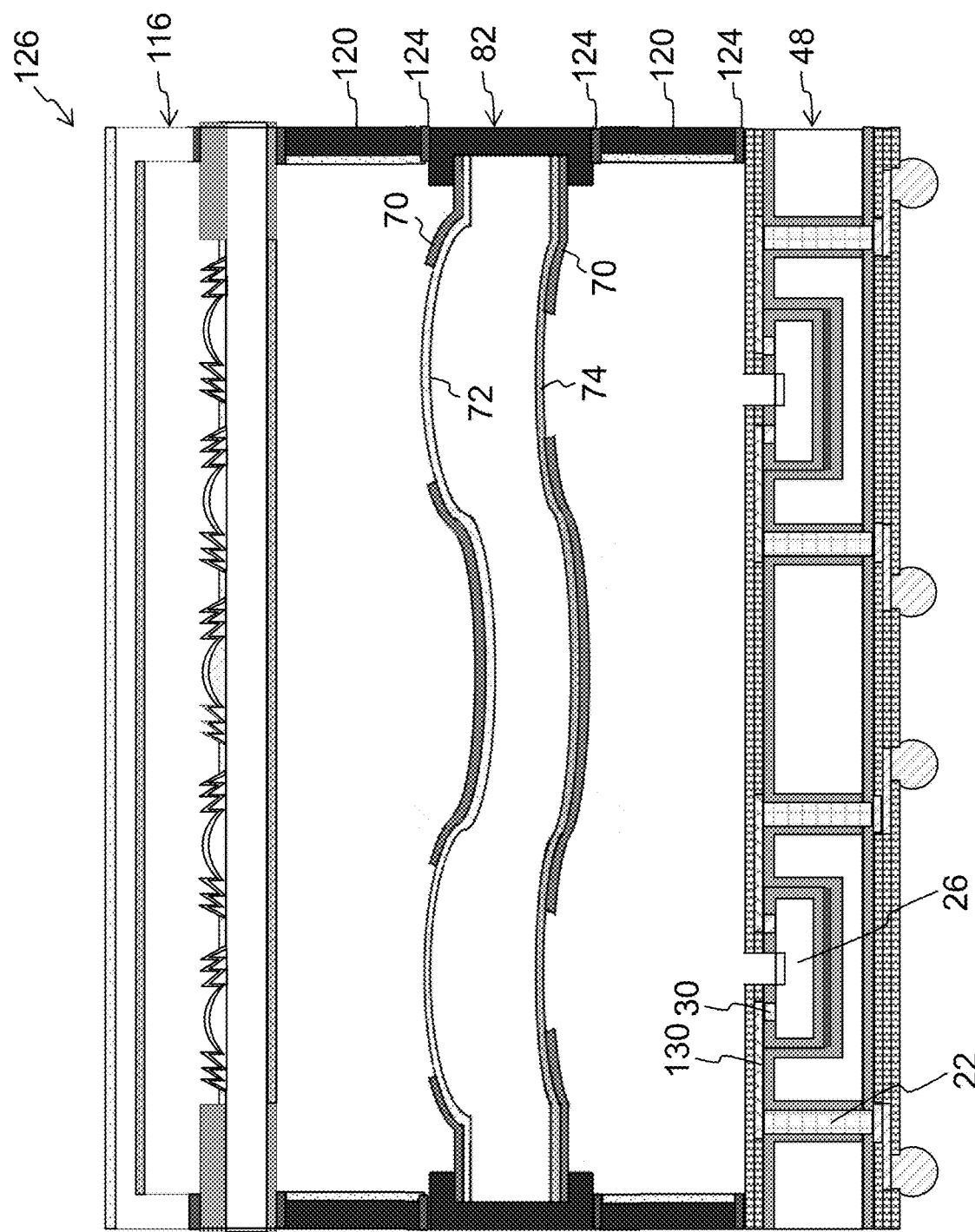
FIG. 11 is a side cross sectional view of a second alternate embodiment of the light source device.

FIG. 11 illustrates a second alternative embodiment, where the filter layer 72 and A/R coating layer 74 are formed on lens substrate 66 first, followed by the formation of metal layer 70. Metal layer 70 is then subjected to a masking/etch process to create the apertures 70a to expose the underlying filter layer 72 and A/R coating layer 74. The resulting structure then has metal layer 72 disposed on layers 72/74.

Figure 12A:
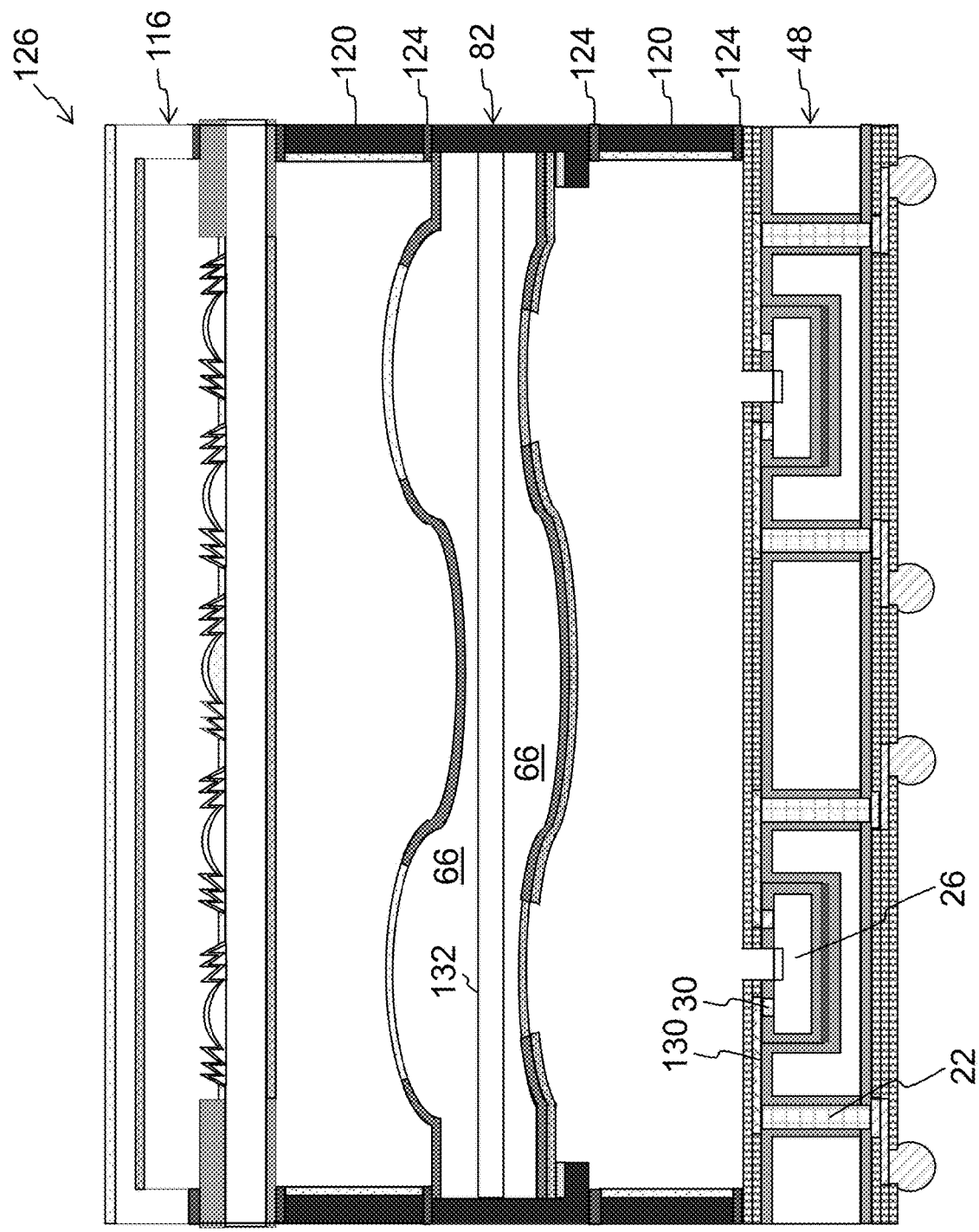
FIG. 12A-12B are side cross sectional views of a third alternate embodiment of the light source device.
Figure 12B:
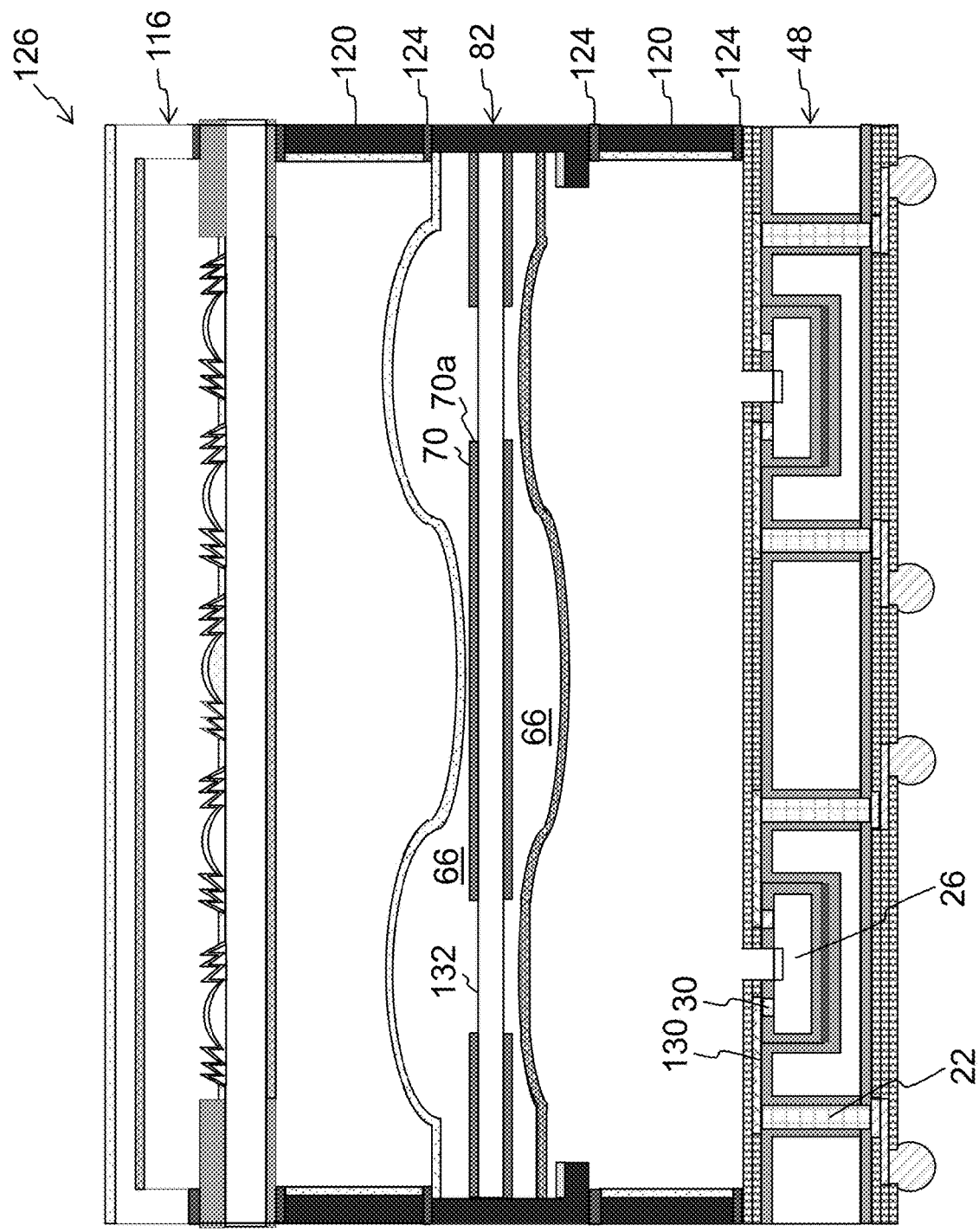
Figure 13A:
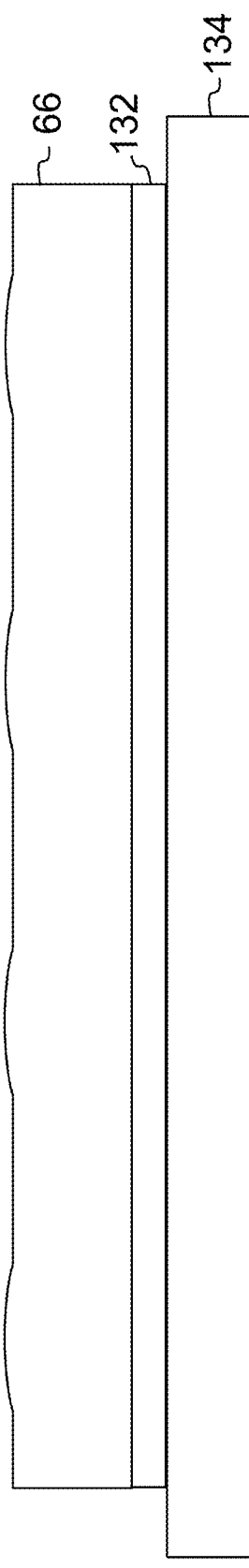
FIGS. 13A-13E are side cross sectional views illustrating the steps in forming an a lens for the third alternate embodiment.
Figure 13B:
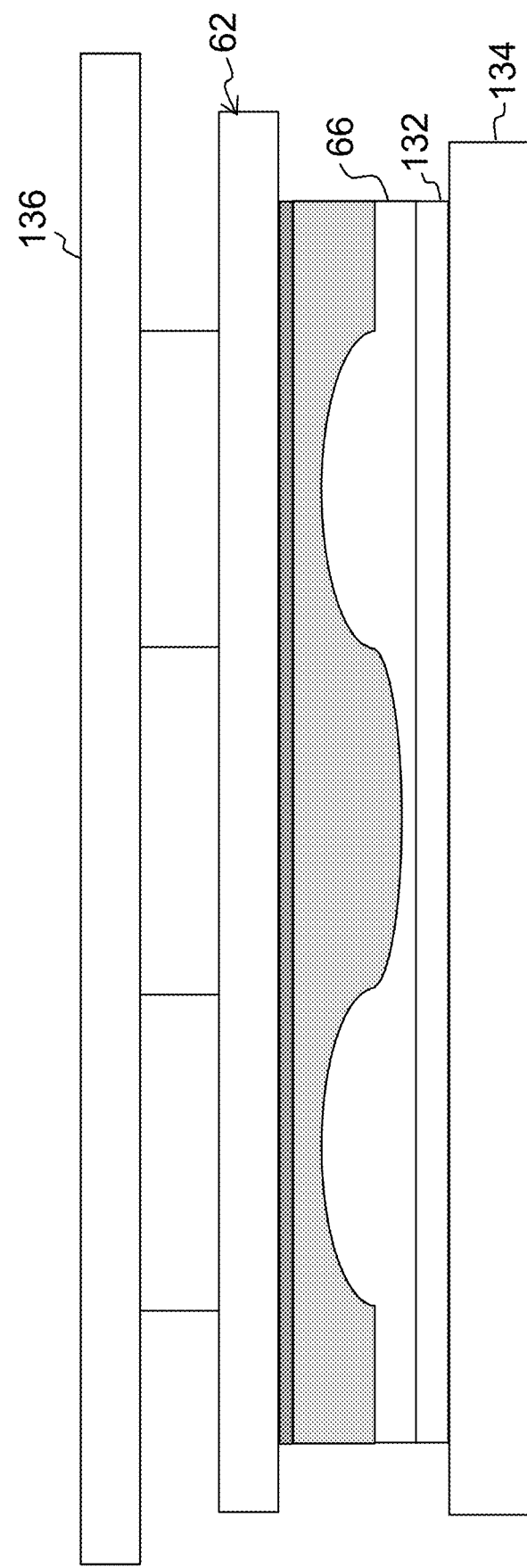
Figure 13C:
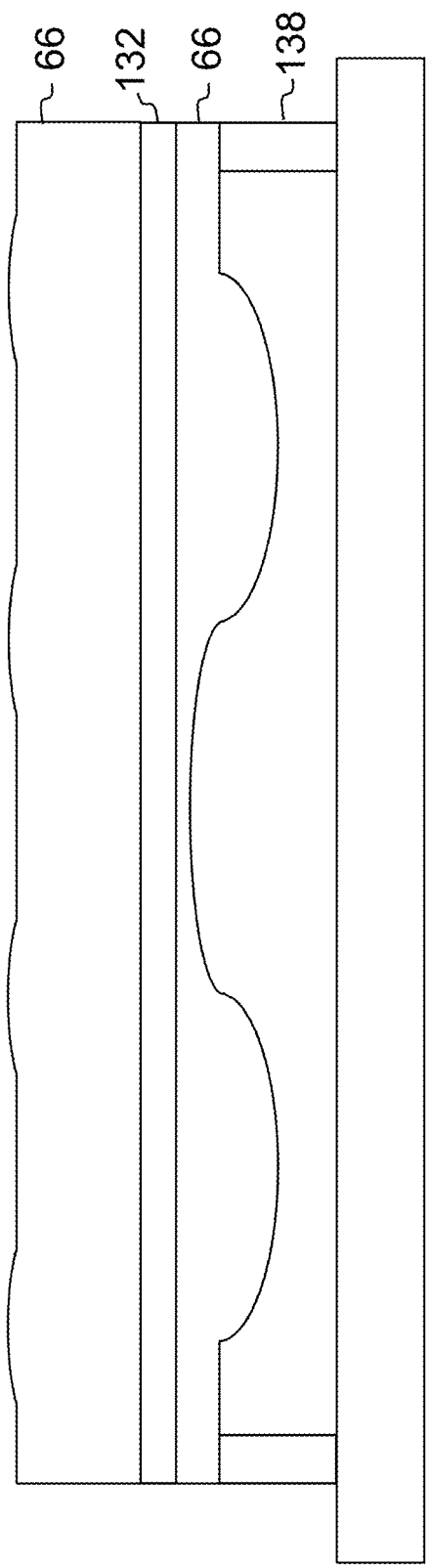
Figure 13E:
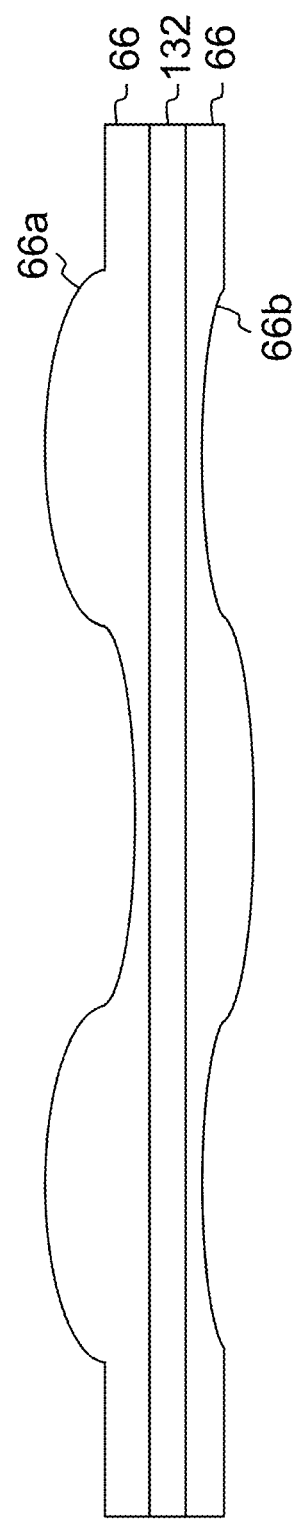
Figure 13D:
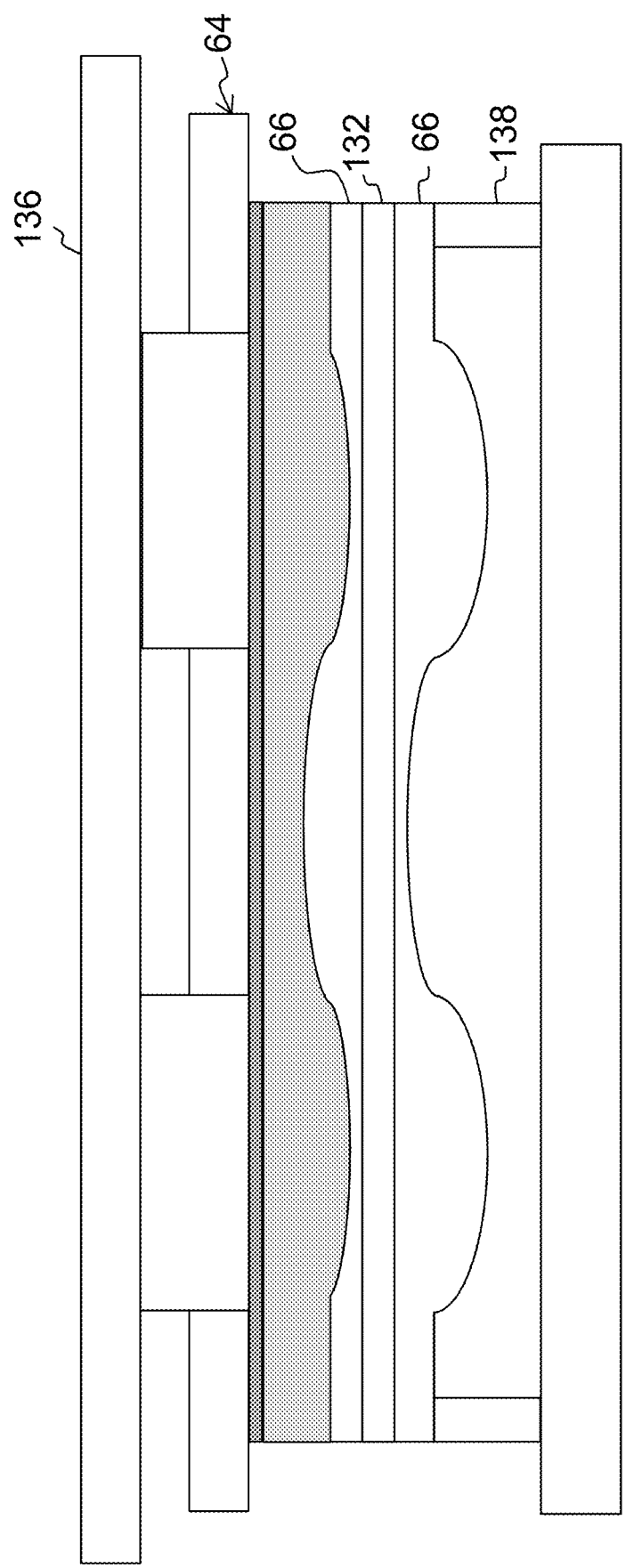

FIG. 12A illustrates a third alternative embodiment, which is the same as that shown in FIG. 10 except that lens assembly 82 includes a glass substrate 132 embedded in the polymer lens substrate 66. FIGS. 13A-13E illustrate the steps in forming the glass-polymer hybrid, and starts with the top and bottom lens replica assemblies 62 and 64 of FIGS. 4C-4D. A glass substrate 132 is placed on a carrier 134, and polymer 66 is deposited on the glass substrate 132, as shown in FIG. 13A. A stamper assembly 136 then presses replica assembly 62 down onto polymer 66 with the desired pressure and temperature so that the upper surface of polymer 66 conforms to (and is cured to) the shape of the polymer layer 56 of assembly 62, as shown in FIG. 13B. Carrier 134 and replica assembly 62 are removed, and replaced with a carrier 138 supporting the edges of polymer 66 and glass substrate 132. Polymer 66 is deposited on the other side of glass substrate 132, as shown in FIG. 13C. Stamper assembly 136 then presses replica assembly 64 down onto polymer 66 with the desired pressure and temperature so that the top surface of polymer 66 conforms to (and is cured to) the shape of the polymer layer 56 of assembly 64, as shown in FIG. 13D. The polymer substrate 66 with embedded glass substrate 132 therein is then extracted (as a lens substrate having the desired upper and lower shaped surfaces 66a/66b), as shown in FIG. 13E. The glass substrate 132 provides additional rigidity to the lens assembly 82, and can make fabrication easier by providing a rigid substrate on which the polymer layers are formed. Moreover, the metal layers 70 defining apertures 70a can be formed on the glass substrate 132 instead of on the polymer layer 66 as previously described, as shown in FIG. 12B. Anti-reflection coatings can be formed on glass substrate 132 as well.

Figure 14:
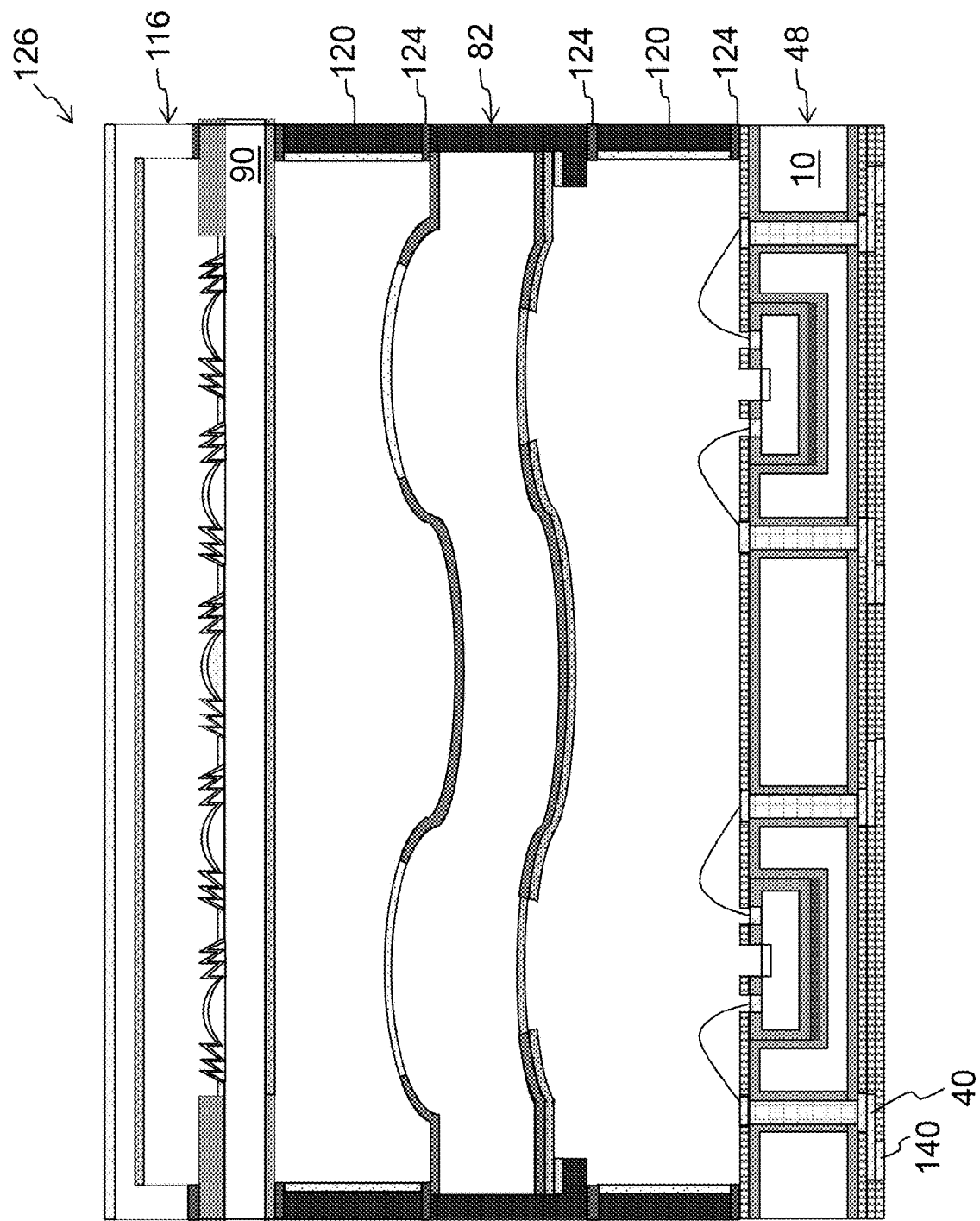
FIG. 14 is a side cross sectional view of a fourth alternate embodiment of the light source device.

FIG. 14 illustrates a fourth alternative embodiment, which is the same as that shown in FIG. 8B except that conductive lands 140 are formed on the redistribution leads 40 instead of solder ball connectors 44. Conductive lands 140 are formed as a layer of conductive material on redistribution leads 40. The advantage of using conductive lands 140 instead of solder ball connectors 44 is that lands 140 are thinner than solder ball connectors.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the light source device of the present invention. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/ elements there between, as well as forming the element indirectly on the substrate with one or more intermediate materials/elements there between.

What is claimed is:

1. A light source device, comprising:
    a light device assembly that includes:
        a first substrate with opposing top and bottom surfaces and a plurality of cavities formed into the top surface,
        a plurality of light source chips each disposed at least partially in one of the plurality of cavities and each including a light emitting device and electrical contacts, and
        a plurality of electrodes each extending between the top and bottom surfaces and each electrically connected to one of the electrical contacts;
    a monolithic lens disposed over the top surface of the first substrate, wherein the monolithic lens includes a unitary substrate with a plurality of lens segments each disposed over one of the light source chips, wherein the unitary substrate includes opposing upper and lower surfaces; and
    a glass substrate disposed in the unitary substrate between the upper and lower surfaces.

2. The light source device of claim 1, wherein the first substrate is formed of silicon.

3. The light source device of claim 1, wherein the unitary substrate is formed of a polymer.

4. The light source device of claim 1, wherein each of the electrodes is electrically connected to one of the electrical contacts by a wire.

5. The light source device of claim 1, wherein each of the electrodes is electrically connected to one of the electrical contacts by a conductive trace formed on the top surface.

6. The light source device of claim 1, further comprising:
    a plurality of solder ball connectors each disposed over the bottom surface and electrically connected to one of the electrodes.

7. The light source device of claim 1, further comprising:
    a plurality of conductive lands each disposed over the bottom surface and electrically connected to one of the electrodes.

8. The light source device of claim 1, wherein:
    at least portions of the upper surface in the plurality of lens segments include a layer of material that selectively filters infrared light; and
    at least portions of the lower surface in the plurality of lens segments include an anti-reflection layer of material.

9. The light source device of claim 1, further comprising:
    a first metal layer disposed on the upper surface and including apertures therein each disposed in one of the lens segments;
    a second metal layer disposed on the lower surface and including apertures therein each disposed in one of the lens segments.

10. The light source device of claim 1, wherein one of the lens segments is shaped to provide light focusing properties different from that of another one of the lens segments.

11. The light source device of claim 1, further comprising:
    a light diffracting lens disposed over the monolithic lens.

12. The light source device of claim 11, wherein the light diffracting lens includes a plurality of micro lenses disposed to diffract light from the light emitting devices passing through the monolithic lens.

13. The light source device of claim 1, wherein one of the light emitting devices of one of the light source chips is disposed closer to the monolithic lens than another one of the light emitting devises of another one of the light source chips.

14. The light source device of claim 1, where each of the plurality of cavities includes a layer of adhesive disposed between a bottom surface of the cavity and the light source chip disposed at least partially in the cavity.

15. The light source device of claim 14, where the layer of adhesive in one of the cavities is thicker than the layer of adhesive in another one of the cavities.

16. The light source device of claim 1, further comprising:
    a spacer of rigid material disposed between the first substrate and the monolithic lens.

17. The light source device of claim 11, further comprising:
- a spacer of rigid material disposed between the light diffracting lens and the monolithic lens.

18. A light source device, comprising:
- a light device assembly that includes:
  - a first substrate with opposing top and bottom surfaces and a plurality of cavities formed into the top surface,
  - a plurality of light source chips each disposed at least partially in one of the plurality of cavities and each including a light emitting device and electrical contacts, and
  - a plurality of electrodes each extending between the top and bottom surfaces and each electrically connected to one of the electrical contacts;
- a monolithic lens disposed over the top surface of the first substrate, wherein the monolithic lens includes a unitary substrate with a plurality of lens segments each disposed over one of the light source chips; and
- a spacer of rigid material disposed between the first substrate and the monolithic lens, wherein the spacer includes a sidewall with a reflective coating.

19. A light source device, comprising:
- a light device assembly that includes:
  - a first substrate with opposing top and bottom surfaces and a plurality of cavities formed into the top surface,
  - a plurality of light source chips each disposed at least partially in one of the plurality of cavities and each including a light emitting device and electrical contacts, and
  - a plurality of electrodes each extending between the top and bottom surfaces and each electrically connected to one of the electrical contacts; and
- a monolithic lens disposed over the top surface of the first substrate, wherein the monolithic lens includes a unitary substrate with a plurality of lens segments each disposed over one of the light source chips;
- a light diffracting lens disposed over the monolithic lens; and
- a spacer of rigid material disposed between the light diffracting lens and the monolithic lens, wherein the spacer includes a sidewall with a reflective coating.

* * * * *